(12) United States Patent
Yamada et al.

(10) Patent No.: US 7,903,451 B2
(45) Date of Patent: Mar. 8, 2011

(54) STORAGE APPARATUS INCLUDING NON-VOLATILE SRAM

(75) Inventors: Yutaka Yamada, Yokohama (JP);
Tatsunori Kanai, Yokohama (JP);
Masaya Tarui, Yokohama (JP); Keiko Abe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 80 days.

(21) Appl. No.: 12/404,510

(22) Filed: Mar. 16, 2009

(65) Prior Publication Data

US 2010/0073991 A1 Mar. 25, 2010

(30) Foreign Application Priority Data

Sep. 25, 2008 (JP) ................................ 2008-246744

(51) Int. Cl.
*G11C 11/00* (2006.01)
(52) U.S. Cl. .................... 365/154; 365/156; 365/158
(58) Field of Classification Search .................. 365/154
See application file for complete search history.

(56) References Cited

U.S. PATENT DOCUMENTS

| | | | | |
|---|---|---|---|---|
| 6,944,050 B2 * | 9/2005 | Kang et al. | ..................... | 365/158 |
| 7,206,217 B2 * | 4/2007 | Ohtsuka et al. | ............... | 365/154 |
| 7,733,145 B2 * | 6/2010 | Abe et al. | ..................... | 327/218 |
| 2008/0080231 A1 | 4/2008 | Abe et al. | | |
| 2008/0298117 A1 | 12/2008 | Hamada et al. | | |
| 2009/0109734 A1 * | 4/2009 | Hanafi | ......................... | 365/158 |
| 2010/0080054 A1 | 4/2010 | Abe | | |

FOREIGN PATENT DOCUMENTS

JP 2008-085770 4/2008

OTHER PUBLICATIONS

Sunami, "Low-Volume Manufacturing on Developing Memory," Semiconductor Memory, Ch. 4, 2008.

* cited by examiner

*Primary Examiner* — Son L Mai
(74) *Attorney, Agent, or Firm* — Turocy & Watson, LLP

(57) ABSTRACT

According to one embodiment, a storage apparatus includes: a first inverter; a second inverter; a first storage element having a first state and a second state; and a second storage element having a third state and a fourth state, wherein the first storage element is brought into the first state when a current flows from the first storage element to the first storage element and is brought into the second state when the current flows from the first storage element to the first storage element, wherein the second storage element is brought into the fourth state when a current flows from the second storage element to the second storage element and is brought into the third state when the current flows from the second storage element to the second storage element.

12 Claims, 21 Drawing Sheets

US 7,903,451 B2

STORAGE APPARATUS INCLUDING NON-VOLATILE SRAM

CROSS-REFERENCE TO RELATED APPLICATIONS

This application is based upon and claims the benefit of priority from Japanese Patent Application No. 2008-246744, filed Sep. 25, 2008, the entire contents of which are incorporated herein by reference.

BACKGROUND

1. Field

The present invention relates to a storage apparatus.

2. Description of the Related Art

A resistance variation type memory (an FeRAM, an MRAM, a PRAM or an ReRAM) has been known as a (non-volatile) semiconductor memory capable of holding stored contents also when a power is not supplied.

Each memory cell of the resistance variation type memory is constituted by a storage element in which a resistance value is varied depending on a logical value ("1" or "0") which is stored. The logical value stored in each memory cell is discriminated corresponding to a magnitude of a current flowing to the storage element.

As means for once blocking the supply of the power and then restarting the same supply, and thereafter carrying out a return at a high speed in the resistance variation type memory, a technique for combining each storage element of the resistance variation type memory with a flip flop has been proposed (for example, JP-A 2008-85570 (KOKAI). JP-A 2008-85570 (KOKAI) has disclosed a method of combining an MTJ element with a flip flop to constitute a nonvolatile flip flop.

In a conventional resistance variation type memory, a logical value of each memory cell is discriminated depending on a magnitude of a current flowing to a storage element. For this reason, there is a disadvantage in that it is necessary to provide, every memory cell, a circuit for converting the current flowing to the storage element into a voltage or a circuit for generating a reference current to be used for discriminating the magnitude of the current flowing to the storage element, resulting in an increase in a circuit scale.

SUMMARY OF THE INVENTION

According to an aspect of the present invention, there is provided a storage apparatus including: a first inverter; a second inverter; a first storage element having a resistance value in a first state which is set to be a first value and a resistance value in a second state which is set to be a second value that is greater than the first value; and a second storage element having a resistance value in a third state which is set to be a third value and a resistance value in a fourth state which is set to be a fourth value that is greater than the third value, wherein an output terminal of the first inverter is connected to an input terminal of the second inverter, herein an output terminal of the second inverter is connected to an input terminal of the first inverter, wherein a first end of the first storage element is connected to the output terminal of the first inverter, wherein a second end of the first storage element is connected to a first end of the second storage element, wherein a second end of the second storage element is connected to the output terminal of the second inverter, wherein the first storage element is brought into the first state when a current flows from the first end of the first storage element to the second end of the first storage element and is brought into the second state when the current flows from the second end of the first storage element to the first end of the first storage element, wherein the second storage element is brought into the fourth state when a current flows from the first end of the second storage element to the second end of the second storage element and is brought into the third state when the current flows from the second end of the second storage element to the first end of the second storage element, and wherein the second end of the first storage element and the first end of the second storage element, and the output terminal of the first inverter and the input terminal of the second inverter are short-circuited.

DETAILED DESCRIPTION

An embodiment according to the invention will be described below.

First Embodiment

Figure 1:
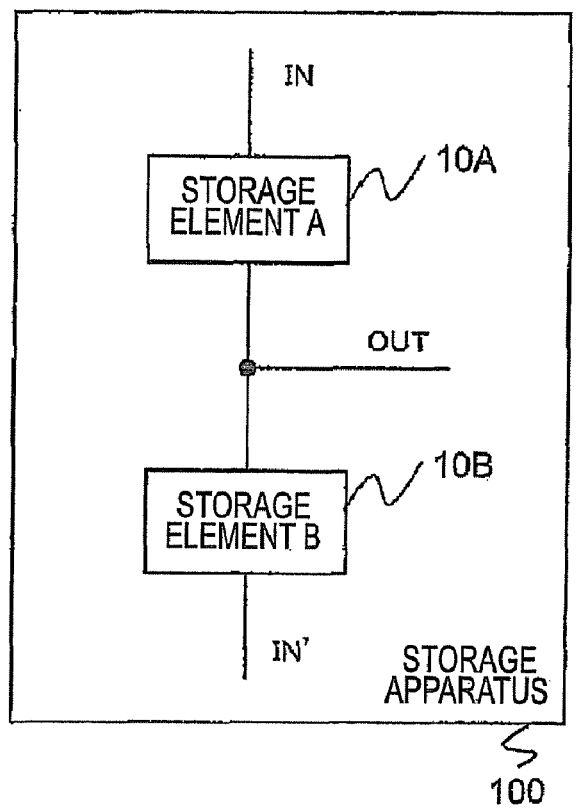
FIG. 1 is a block diagram showing a structure of a storage apparatus according to a first embodiment.

FIG. 1 is a block diagram showing a storage apparatus 100 according to a first embodiment.

The storage apparatus 100 according to the first embodiment includes a storage element 10A and a storage element 10B. The storage element 10A and the storage element 10B are connected in series. One of ends of the storage element 10A is connected to an input signal line IN. The other end of the storage element 10A is connected to the storage element 10B and an output signal line OUT. One of ends of the storage element 10B is connected to the storage element 10A and the output signal line OUT. The other end of the storage element 10B is connected to an input signal line IN'.

The storage elements 10A and 10B store logical values. The logical values stored in the storage elements 10A and 10B are output from the output signal line OUT.

The storage elements 10A and 10B can take a first resistance state (a logical value of "1") and a second resistance state (a logical value of "0"). Depending on a direction in which a current flows to the storage elements 10A and 10B, the storage elements 10A and 10B are set into "1" (the first resistance state) or "0" (the second resistance state). Examples of the storage elements 10A and 10B include an MTJ (Magnetic Tunnel Junction) element used in an MRAM and a CMR (Colossal Electro-Resistance) element used in an ReRAM.

When a current flows from the input signal line IN to the input signal line IN', the storage element 10A is set into "1" (the first resistance state). When the current flows from the input signal line IN' to the input signal line IN, the storage element 10A is set into "0" (the second resistance state).

When the current flows from the input signal line IN to the input signal line IN', the storage element 10B is set into "0" (the second resistance state). When the current flows from the input signal line IN' to the input signal line IN, the storage element 10B is set into "1" (the first resistance state).

Figure 2:
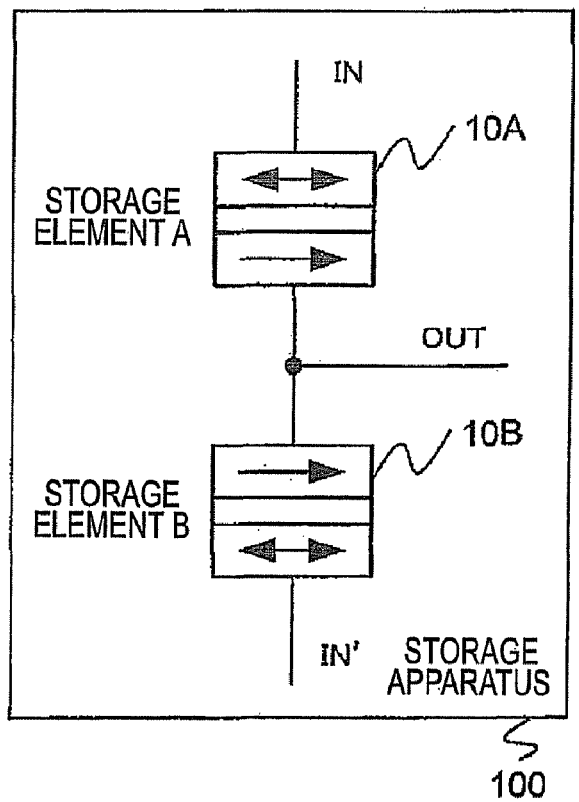
FIG. 2 is a block diagram showing an implementation example of the storage apparatus according to the first embodiment.

FIG. 2 is a diagram showing a structure of the storage apparatus 100 in the case in which the storage elements 10A and 10B are constituted by the MTJ element.

In the storage element 10A, a free layer (a two-way arrow) is provided on an upper side (the input signal line IN side) and a fixed layer (a one-way arrow) is provided on a lower side (the input signal line IN' side). In the storage element 10B, a fixed layer (a one-way arrow) is provided on the upper side (the input signal line IN side) and a free layer (a two-way arrow) is provided on the lower side (the input signal line IN' side). By disposing the fixed layers and the free layers in the storage elements 10A and 10B, thus, it is possible to set the directions of the fixed layers of the storage elements 10A and 10B to be identical to each other.

In the storage apparatus 100 according to the first embodiment, both of the storage elements 10A and 10B may be disposed in reverse directions to the directions described above.

Figure 3:
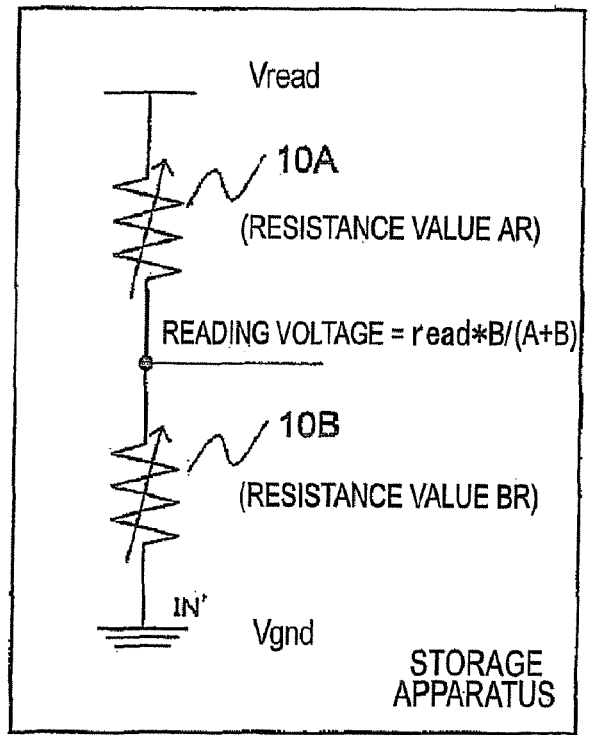
FIG. 3 is a diagram showing a read of a logical value from the storage apparatus according to the first embodiment.

FIG. 3 is a diagram showing a read of the logical values stored in the storage elements 10A and 10B. A resistance value of the storage element 10A is AR (A is an integer which is equal to or greater than zero). A resistance value of the storage element 10B is BR (B is an integer which is equal to or greater than zero). Vread is applied to the input signal line IN. The input signal line IN' is set to be a GND (=0V).

A voltage of the output signal line OUT in an application of a voltage between the input signal line IN and the input signal line IN' is measured so that the logical values stored in the storage elements 10A and 10B are read. The voltage of the output signal line OUT is expressed in [Vread X {B/(A+B)}].

If the voltage of the output signal line OUT is equal to or higher than a minimum input voltage (a first threshold) of the logical value "1" (HIGH), the logical value "1" is read from the storage apparatus 100. If the voltage of the output signal line OUT is equal to or lower than a maximum input voltage (a second threshold) of the logical value "0" (LOW), the logical value "0" is read from the storage apparatus 100.

In the following, a source voltage (Vread) is supposed to be 1V. In the storage elements 10A and 10B, the resistance value in the first resistance state ("1") is supposed to be R and the resistance value in the second resistance state ("0") is supposed to be 3R.

Figure 4:
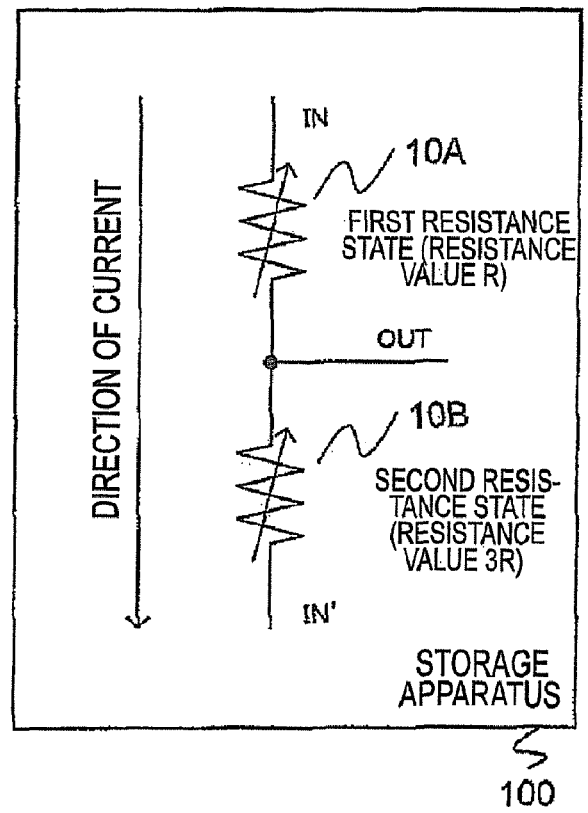
FIG. 4 is a diagram showing a write of a logical value of "1" from the storage apparatus according to the first embodiment.

FIG. 4 is a diagram showing a write of the logical value "1" to the storage apparatus 100.

In the case in which the logical value "1" is written to the storage apparatus 100 (the storage elements 10A and 10B), a current is caused to flow in a direction from the input signal line IN to the input signal line IN' (FIG. 4). The storage element 10A is set into "1" (the first resistance state: the resistance value R). The storage element 10B is set into "0" (the second resistance state: the resistance value 3R). When 1 V is applied to the input signal line IN and the input signal line IN' is set to be the GND as shown in FIG. 3, a voltage of the output signal line OUT is 0.75 V ("1"). Thus, the storage element 10A is set into "1" and the storage element 10B is set into "0" so that "1" is stored in the storage apparatus 100.

Figure 5:
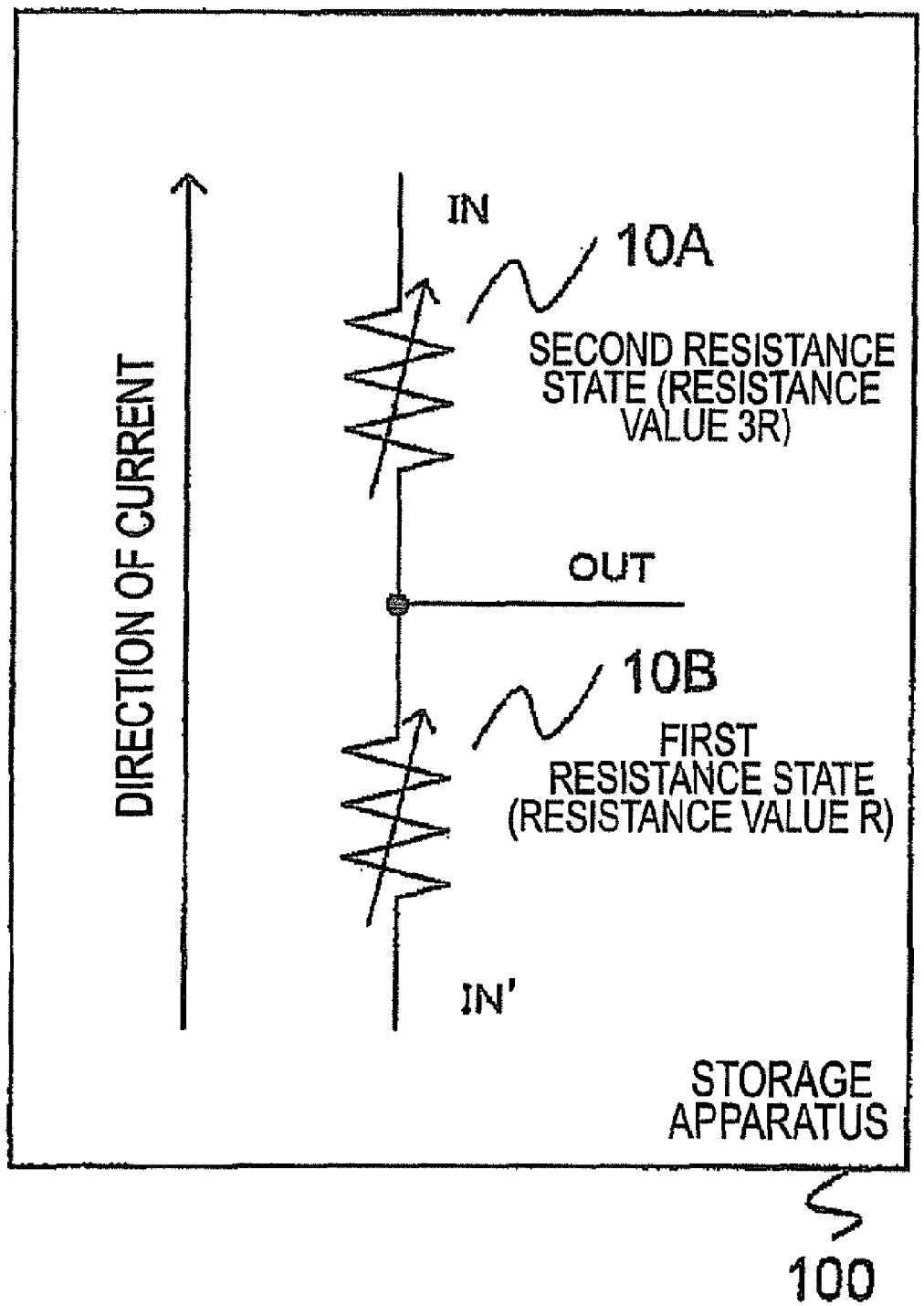
FIG. 5 is a diagram showing a write of a logical value of "0" from the storage apparatus according to the first embodiment.

FIG. 5 is a diagram showing a write of the logical value "0" to the storage apparatus 100.

In the case in which the logical value "0" is written to the storage apparatus 100 (the storage elements 10A and 10B), a current is caused to flow in a direction from the input signal line IN' to the input signal line IN (FIG. 5). The storage element 10A is set into "0" (the second resistance state: the resistance value 3R). The storage element 10B is set into "1" (the first resistance state: the resistance value R). When 1 V is applied to the input signal line IN and the input signal line IN' is set to be the GND as shown in FIG. 3, the voltage of the output signal line OUT is 0.25 V. Thus, the storage element 10A is set into "0" and the storage element 10B is set into "1" so that "0" is stored in the storage apparatus 100.

According to the document "Digital Electronics and Design with VHDL pp. 14 FIG. 1.12", in an LVCMOS having a source voltage of 1 V, a minimum input voltage of a logical value "1" is set to be 0.65 V and a maximum input voltage of a logical value "0" is set to be 0.35 V. If a voltage of a signal line is equal to or higher than 0.65 V, "1" (HIGH) is set. If the voltage of the signal line is equal to or lower than 0.35 V, "0" (LOW) is set.

In the case in which the storage apparatus 100 is driven with a source voltage of 1 V, the logical value of "1" is read when the voltage of the output signal line OUT is equal to or higher than 0.65 V, and the logical value of "0" is read when the voltage of the output signal line OUT is equal to or lower than 0.35 V.

When a difference between the resistance value in the first resistance state and that in the second resistance state is increased, the storage apparatus 100 can be operated more stably. In the following, the source voltage is set to be 1 V, the resistance value in the first resistance state ("1") is set to be R and that in the second resistance state ("0") is set to be 3R if there is no particular permission. The values do not need to be always set.

According to the storage apparatus 100 in accordance with the first embodiment, thus, it is possible to reduce a scale of a circuit for reading a resistance variation in a storage element having a resistance value varied depending on a direction of a flowing current by connecting the storage element in series in a reverse direction.

In the storage apparatus 100 according to the first embodiment, it is assumed that the source voltage (1 V) is applied to the input signal line IN and the input signal line IN' is set to be the GND when the logical value stored in the storage apparatus 100 is to be read.

However, a voltage to be applied to the input signal line IN can have a greater value than a source voltage to be supplied logically and a ground voltage of the input signal line IN' can have a smaller value than a ground voltage to be supplied logically.

For example, in the case in which the logical value "1" is stored in the storage apparatus 100 by an application of 1.5 V to the input signal line IN and an application of −0.5 V to the input signal line IN', the voltage of the output signal line OUT can be set to be 1.0 V. In the case in which the logical value "0" is stored in the storage apparatus 100, moreover, the voltage of the output signal line OUT can be set to be 0 V.

Also in the case in which the resistance value of the storage element has a fluctuation, thus, it is possible to prevent the logical value stored in the storage apparatus 100 from being determined erroneously, thereby implementing a stabler operation.

Second Embodiment

In storage apparatuses according to the following embodiments, it is possible to carry out both a volatile write/read and a nonvolatile write/read to/from the storage apparatuses. The "volatile" implies a property that information is lost when a power is cut off. The "nonvolatile" implies a property that the information is not lost also when the power is cut off. They will be described discriminatively as follows.

The volatile write to the storage apparatus will be referred to as a load processing. A processing for reading information written through the volatile write (the load processing) from the storage apparatus will be referred to as a store processing. A nonvolatile write to the storage apparatus will be referred to as a backup processing. A processing for reading information written through the nonvolatile write (the backup processing) from the storage apparatus will be referred to as a restore processing. A write/read to/from the storage elements 10A and 10B will be simply referred to as a write/read.

Figure 6:
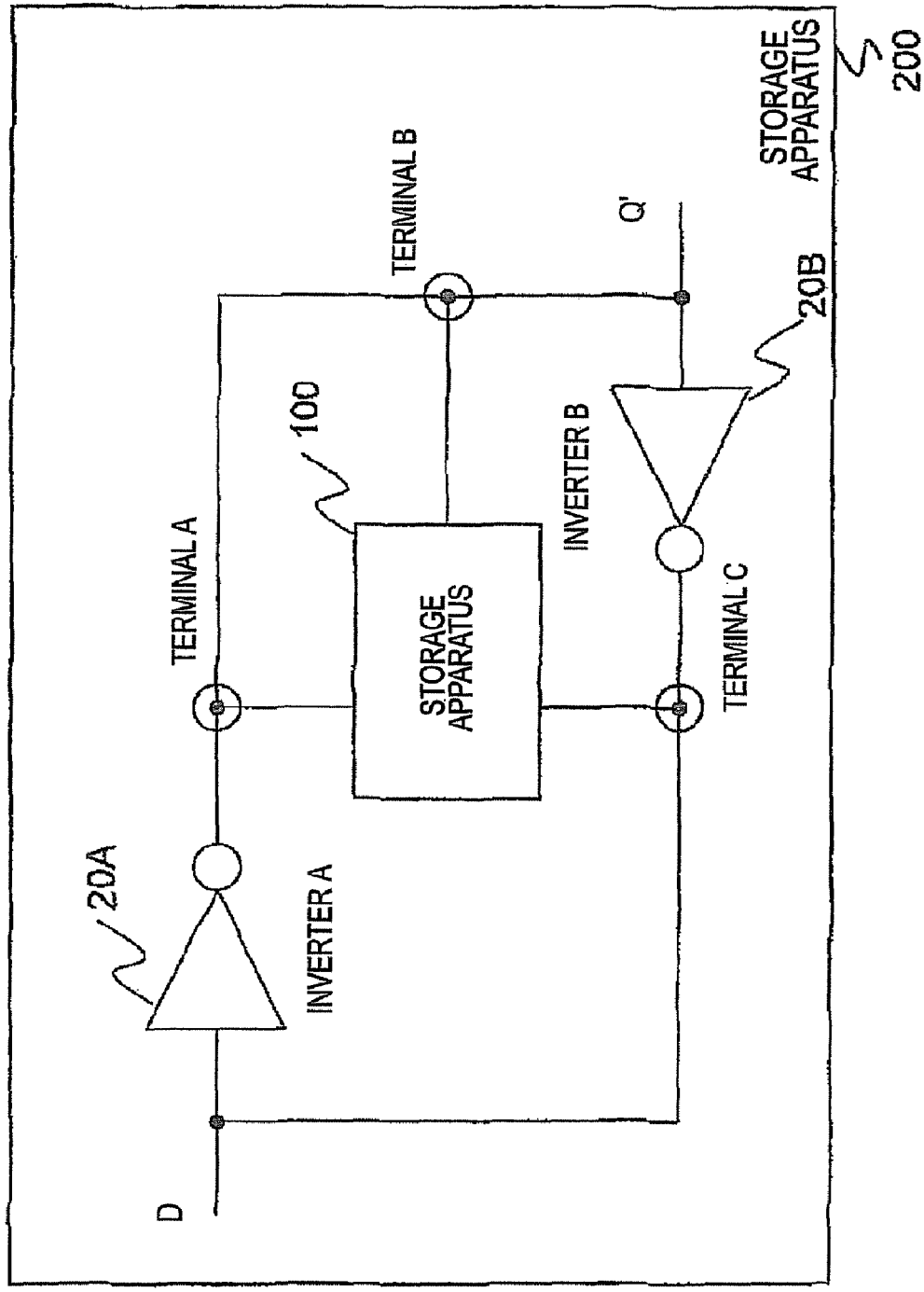
FIG. 6 is a block diagram showing a structure of a storage apparatus according to a second embodiment.

FIG. 6 is a block diagram showing a structure of a storage apparatus 200 according to a second embodiment.

The storage apparatus 200 according to the second embodiment includes an inverter 20A, an inverter 20B and the storage apparatus 100 according to the first embodiment. An output terminal of the inverter 20A is connected to an input terminal of the inverter 20B. An output terminal of the inverter 20B is connected to an input terminal of the inverter 20A. The input signal line IN of the storage apparatus 100 according to the first embodiment is connected to a terminal A. The input signal line IN' of the storage apparatus 100 according to the first embodiment is connected to a terminal C. The output signal line OUT of the storage apparatus 100 according to the first embodiment is connected to a terminal B.

If the input signal D is "1", the terminal A and an output signal Q' are set into "0" and the terminal C is set into "1". If the input signal D is "0", the terminal A and the output signal Q' are set into "1" and the terminal C is set into "0".

The inverters 20A and 20B constitute a latch circuit. Logical values held by the inverters 20A and 20B (the latch circuit) are volatile. The logical value stored in the storage apparatus 100 according to the first embodiment is nonvolatile.

According to the storage apparatus 200 in accordance with the second embodiment, thus, it is possible to simply and easily backup the logical value stored in the latch circuit into the nonvolatile storage apparatus 200 in a small circuit scale by combining the latch circuit with the nonvolatile storage apparatus 100 according to the first embodiment.

If the latch circuit of the storage apparatus 200 according to the second embodiment is used for a memory cell of an SRAM, furthermore, it is possible to simply and easily backup contents stored in the SRAM into a nonvolatile storage region.

(Variant 1 of Second Embodiment)

Figure 7:
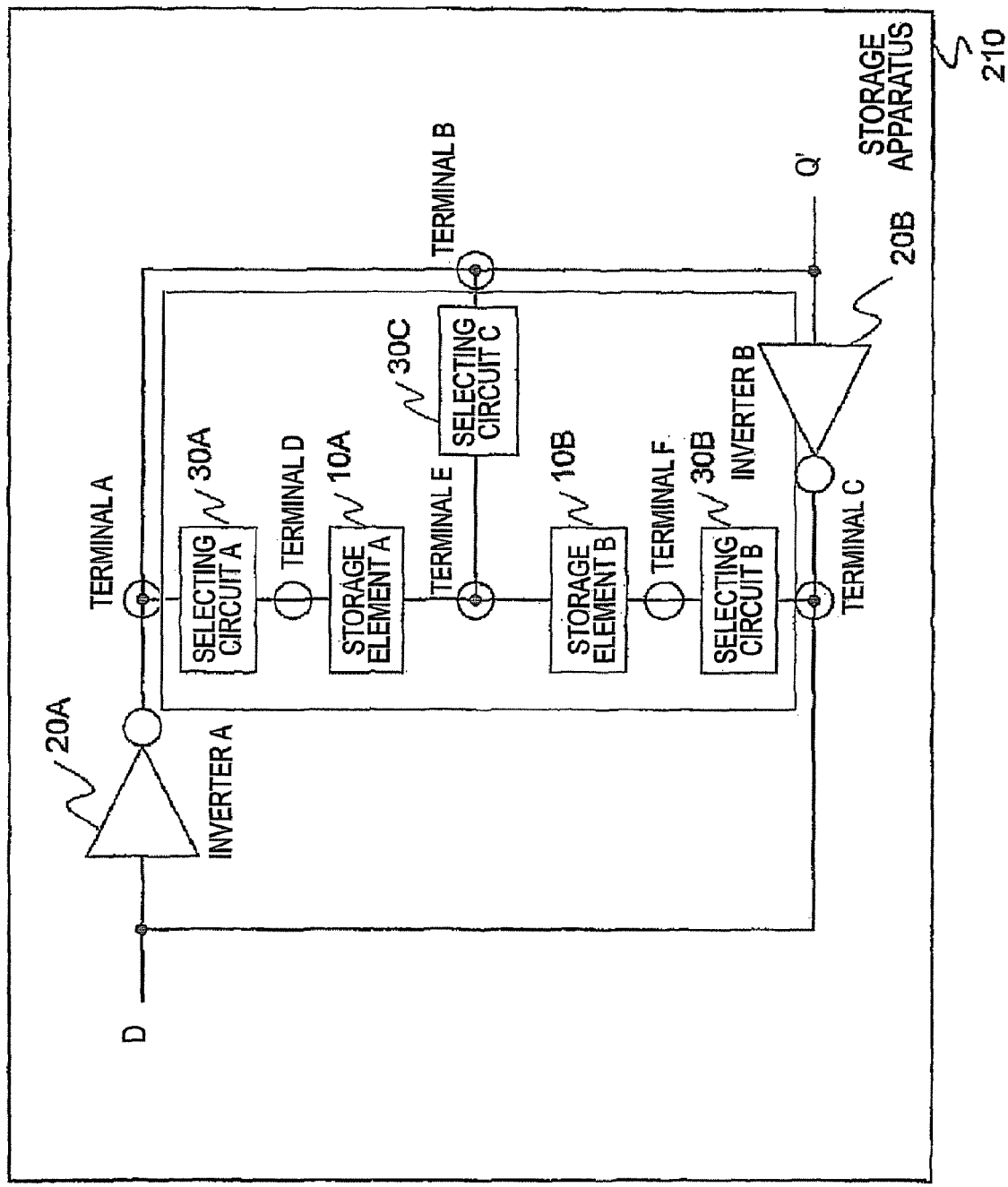
FIG. 7 is a block diagram showing a structure of a storage apparatus according to a variant 1 of the second embodiment.

FIG. 7 is a block diagram showing a structure of a storage apparatus 210 according to a variant 1 of the second embodiment.

The storage apparatus 210 according to the variant 1 of the second embodiment includes an inverter 20A, an inverter 20B, a storage element 10A, a storage element 10B, a selecting circuit 30A, a selecting circuit 30B, and a selecting circuit 30C.

The inverters 20A and 20B constitute a latch circuit.

The storage elements 10A and 10B constitute the storage apparatus 100 according to the first embodiment.

When a current flows from a terminal D to a terminal E, the storage element 10A is set into "1" (a first resistance state: a resistance value R). When the current flows from the terminal E to the terminal D, the storage element 10A is set into "0" (a second resistance state: a resistance value 3R).

When a current flows from the terminal E to a terminal F, the storage element 10B is set into "0" (a second resistance state: a resistance value 3R). When the current flows from the terminal F to the terminal E, the storage element 10B is set into "1" (a first resistance state: a resistance value R).

The selecting circuit 30A connects one of ends (the terminal D) of the storage element 10A to an output terminal (a terminal A) of the inverter 20A, connects the end (the terminal D) of the storage element 10A to one of supply lines of a source voltage, or opens the end (the terminal D) of the storage element 10A.

In the case in which logical values held by the inverters 20A and 20B are written to the storage elements 10A and 10B (a backup processing), the selecting circuit 30A connects the end (the terminal D) of the storage element 10A to the output terminal (the terminal A) of the inverter 20A.

In the case in which logical values stored in the inverters 10A and 10B are held by the inverters 20A and 20B (a restore processing), the selecting circuit 30A connects the end (the terminal D) of the storage element 10A to the supply line of the source voltage.

In the case in which a store processing or a load processing is carried out over the inverters 20A and 20B (the latch circuit), the selecting circuit 30A opens the end (the terminal D) of the storage element 10A.

The selecting circuit 30B connects the end (the terminal F) of the storage element 10B to an output terminal (a terminal C) of the inverter 20B, grounds the end (the terminal F) of the storage element 10B, and opens the end (the terminal F) of the storage element 10B.

In the case in which the logical values held by the inverters 20A and 20B are written to the storage elements 10A and 10B (the backup processing), the selecting circuit 30B connects the end (the terminal F) of the storage element 10B to the output terminal (the terminal C) of the inverter 20B.

In the case in which the logical values stored in the storage elements 10A and 10B are held by the inverters 20A and 20B (the restore processing), the selecting circuit 30B grounds the end (the terminal F) of the storage element 10B.

In the case in which the store processing or the load processing is carried out over the inverters 20A and 20B (the latch circuit), the selecting circuit 30B opens the end (the terminal C) of the storage element 10B.

The selecting circuit 30C short-circuits or opens the connecting portion (the terminal E) of the storage elements 10A and 10B and a connecting portion (a terminal B) of an output of the inverter 20A and an input of the inverter 20B.

In the case in which the logical values stored in the storage elements 10A and 10B are held by the inverters 20A and 20B (the restore processing), the selecting circuit 30C short-circuits the terminals E and B. In the other cases, the selecting circuit 30C opens the terminals E and B.

Figure 8:
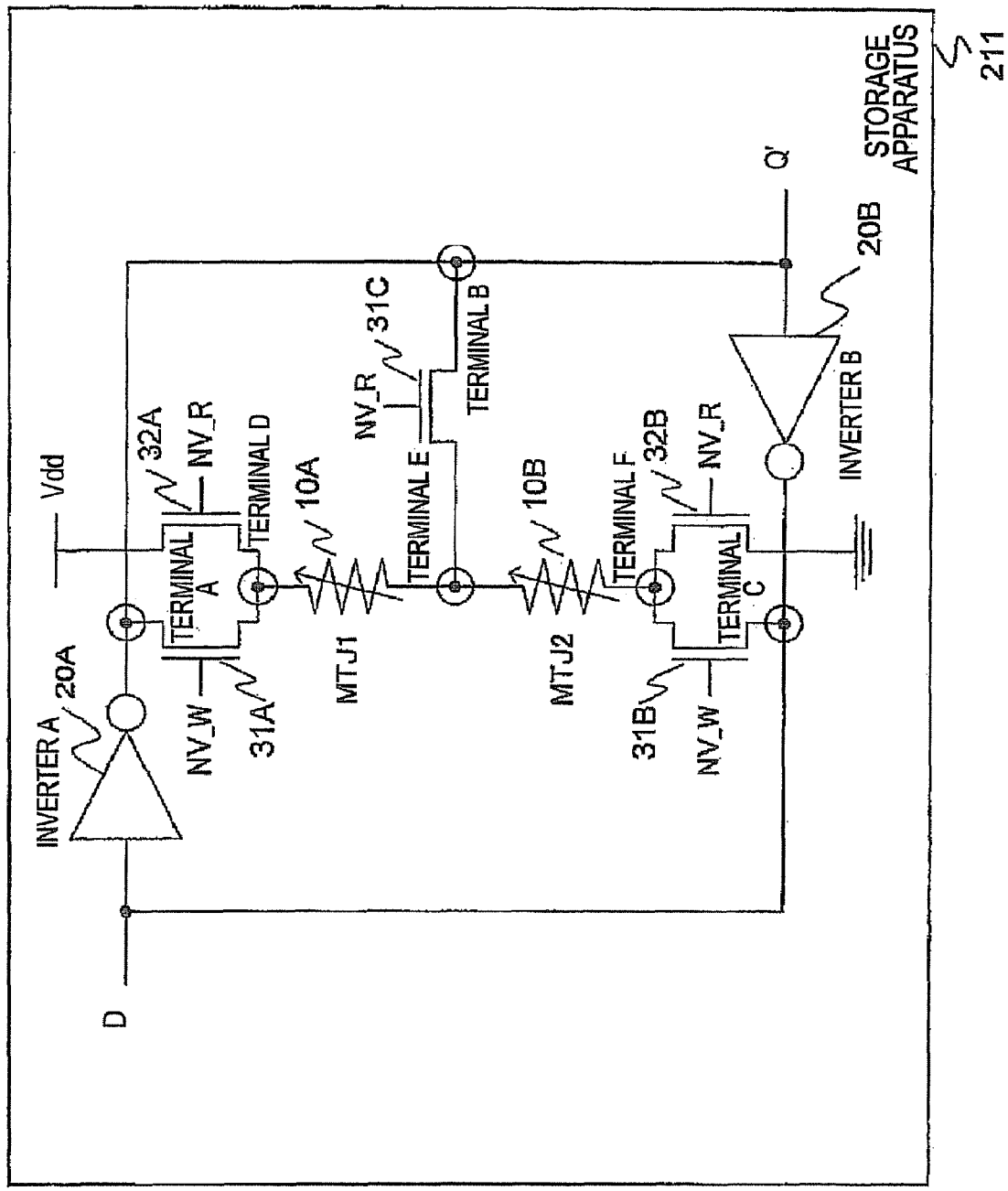
FIG. 8 is a block diagram showing an implementation example of the storage apparatus according to the variant 1 of the second embodiment.

FIG. 8 is a diagram showing an implementation example 211 of the storage apparatus 210 according to the variant 1 of the second embodiment.

The storage elements 10A and 10B are MTJ elements (MTJ1, MTJ2). The storage, elements 10A and 10B may be CMR elements.

The selecting circuit 30A includes a transistor 31A which is controlled in response to a control signal NV_W and connects the terminals D and A, and a transistor 32A which is controlled in response to a control signal NV_R and connects the terminal D to the power supply line.

The selecting circuit 30B includes a transistor 31B which is controlled in response to the control signal NV_W and connects the terminals F and C, and a transistor 32B which is controlled in response to the control signal NV_R and grounds the terminal F.

The selecting circuit 30C includes a transistor 31C which is controlled in response to the control signal NV_R and connects the terminals E and B.

In an operation of a flip flop, the control signals NV_W and NV_R are set to be invalid. In the case in which the backup processing is carried out, only the control signal NV_W is set to be valid. In the case in which the restore processing is carried out, only the control signal NV_R is set to be valid.

Figure 9:
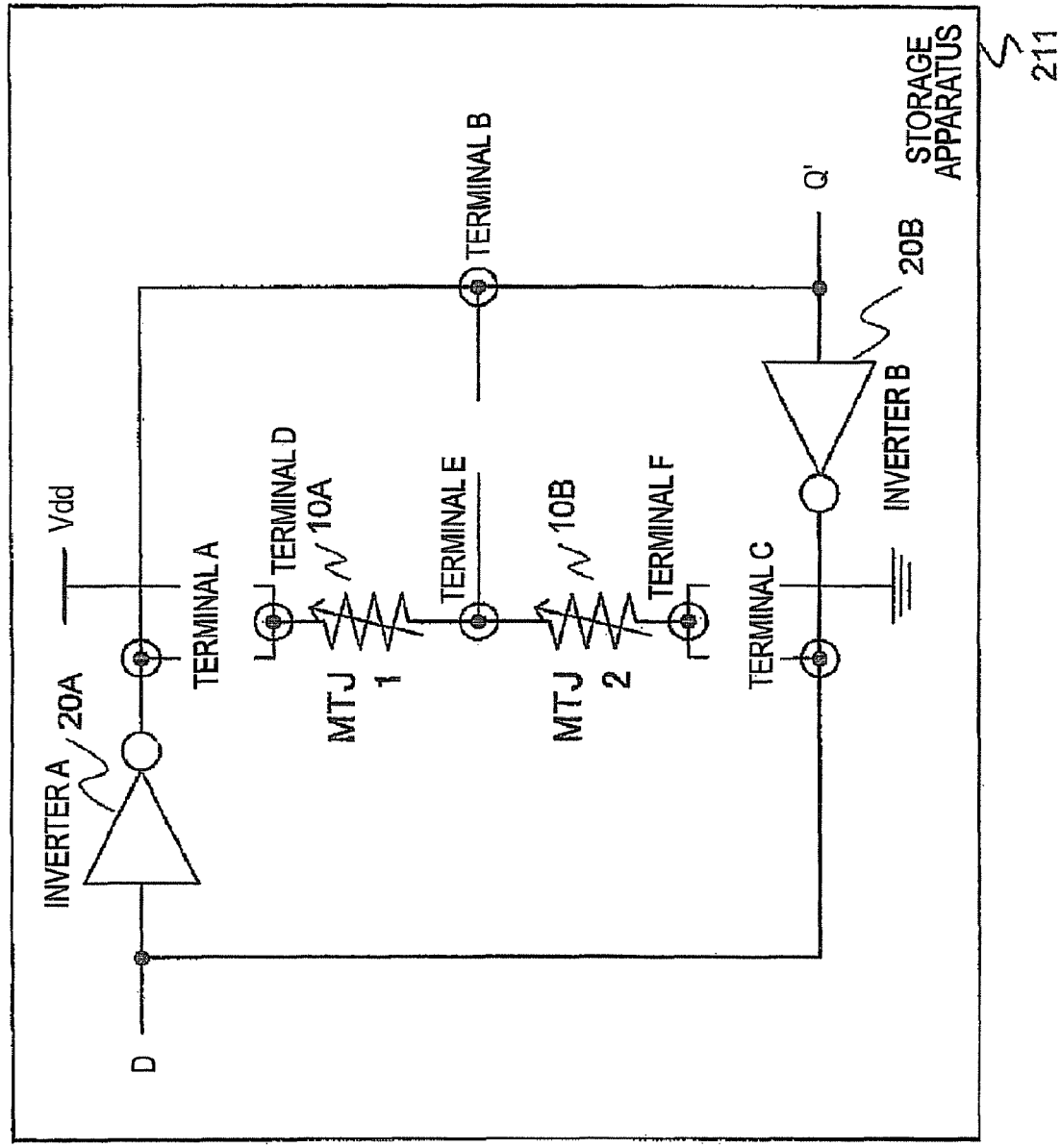
FIG. 9 is a typical diagram showing an operating state of the storage apparatus according to the variant 1 of the second embodiment.

FIG. 9 is a typical diagram showing a structure of the storage apparatus 210 in the case in which the storage apparatus 210 is operated as the flip flop (the control signal NV_W: invalid, the control signal NV_R: invalid).

In the case in which neither the backup processing nor the restore processing is carried out over the nonvolatile storage elements 10A and 10B, the storage elements 10A and 10B are opened by the selecting circuits 30A, 30B and 30C. The storage apparatus 210 is operated as the latch circuit constituted by the inverters 20A and 20B.

Figure 10:
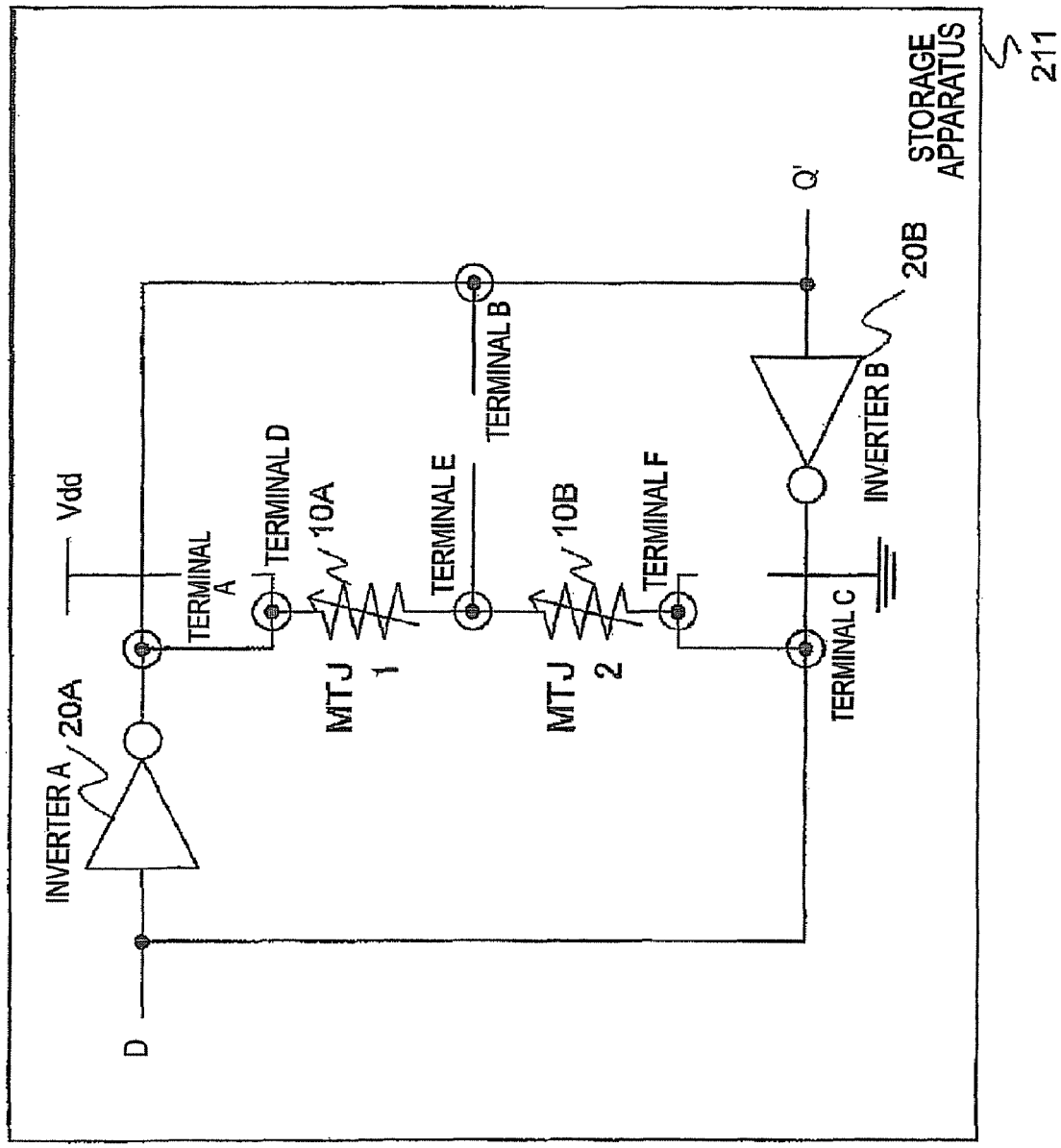
FIG. 10 is a typical diagram showing the operating state of the storage apparatus according to the variant 1 of the second embodiment.

FIG. 10 is a typical diagram showing the structure of the storage apparatus 210 in the case in which the storage apparatus 210 carries out the backup processing (the control signal NV_W: valid, the control signal NV_R: invalid).

In the case in which the backup processing is carried out over the nonvolatile storage elements 10A and 10B, the terminals A and D are connected to each other by the selecting circuit 30A, the terminals F and C are connected to each other by the selecting circuit 30B, and the terminals E and B are opened by the selecting circuit 30C.

In the case in which the inverter 20A outputs "1" and the inverter 20B outputs "0", a current flows from the terminal A to the terminal C through the storage elements 10A and 10B. Accordingly, the storage element 10A is set into "1" and the storage element 10B is set into "0".

In the case in which the inverter 20A outputs "0" and the inverter 20B outputs "1", a current flows from the terminal C to the terminal A through the storage elements 10A and 10B. Accordingly, the storage element 10A is set into "0" and the storage element 10B is set into "1".

Thus, the logical values held by the inverters 20A and 20B are stored (backuped) in the nonvolatile storage elements 10A and 10B.

Figure 11:
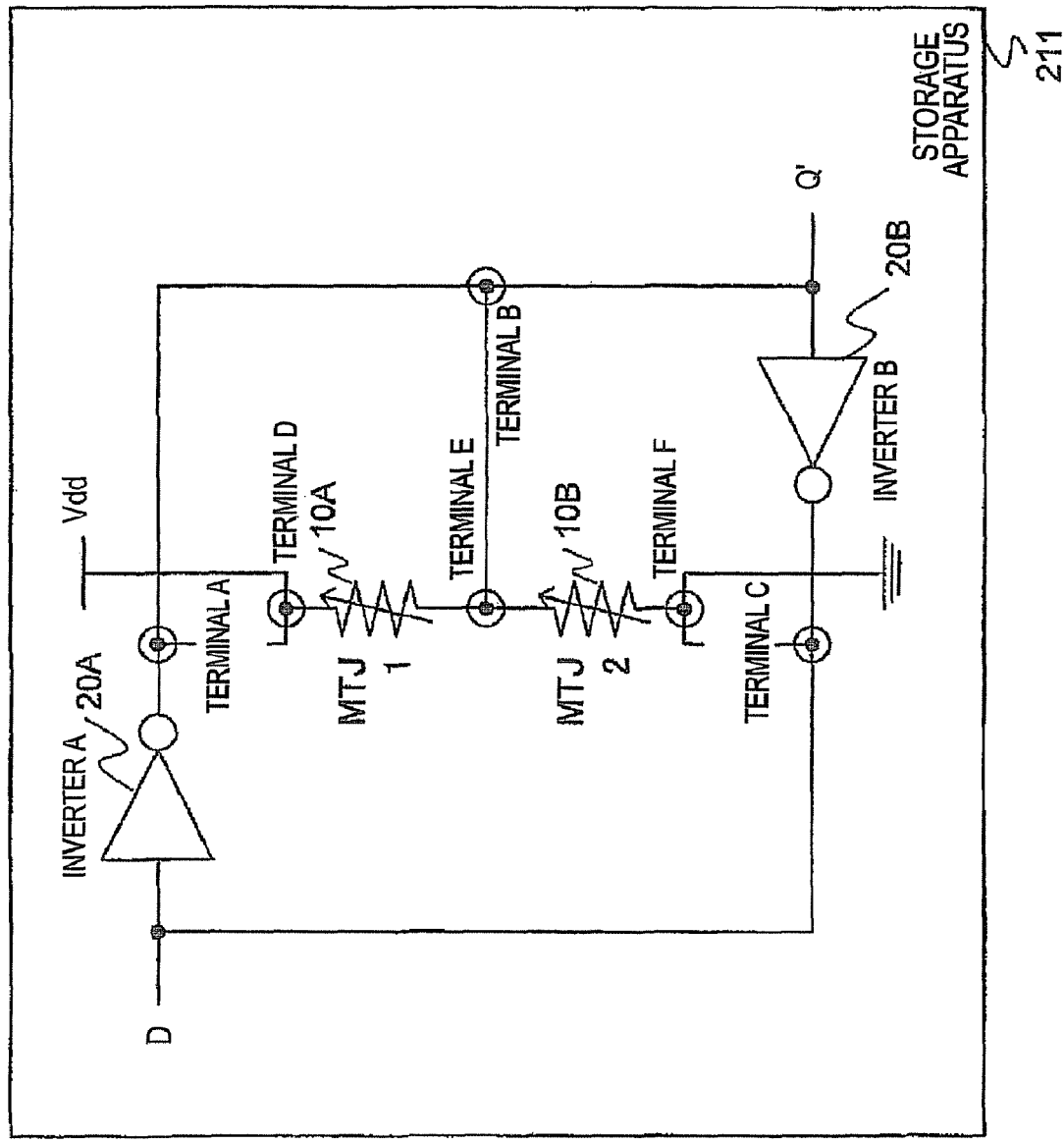
FIG. 11 is a typical diagram showing the operating state of the storage apparatus according to the variant 1 of the second embodiment.

FIG. 11 is a typical diagram showing the structure of the storage apparatus 210 in the case in which the storage apparatus 210 carries out the restore processing (the control signal NV_W: invalid, the control signal NV_R: valid).

In the case in which the restore processing is carried out through the nonvolatile storage elements 10A and 10B, the terminal D is connected to the power supply line by the selecting circuit 30A, the terminal F is grounded by the selecting circuit 30B and the terminals E and B are short-circuited by the selecting circuit 30C. A source voltage is applied between the terminals F and D and a divided voltage of the storage elements 10A and 10B is input to the inverter 20B through the terminal E, the selecting circuit 30C and the terminal B.

For example, in the case in which the backup processing is carried out when an output Q' is "1" (the output of the inverter 20A is "1" and the output of the inverter 20B is "0") and the restore processing is then carried out, voltages of the terminals E and B are set to be 0.75 V and an input to the inverter 20B is set into "1". The output of the inverter 20B is set into "0", the output of the inverter 20A is set into "1" and the output Q' is set into "1".

For example, in the case in which the backup processing is carried out when the output Q' is "0" (the output of the inverter 20A is "0" and the output of the inverter 20B is "1") and the restore processing is then carried out, the voltages of the terminals E and B are set to be 0.25 V and an input to the inverter 20B is set into "0". The output of the inverter 20B is set into "1", the output of the inverter 20A is set into "0" and the output Q' is set into "0".

Thus, the logical values held by the inverters 20A and 20B are held (restored) in the nonvolatile storage elements 10A and 10B.

In the storage apparatus 210 according to the variant 1 of the second embodiment, thus, the latch circuit and the nonvolatile storage apparatus 210 according to the first embodiment are combined with each other through the selecting circuit. In addition to the advantages of the storage apparatus 210 according to the second embodiment, consequently, it is possible to enhance a processing speed in the operation of the flip flop and to reduce a consumed power.

In the case in which the restore processing is carried out, it is possible to implement a stabler operation by particularly causing the control signal NV_R to be valid and then causing a source voltage Vdd to rise in an element having a low resistance variation ratio with "1" and "0", for example, an MTJ element. As in the CMR element, a stable operation can be carried out even if the source voltage Vdd is caused to rise and the control signal NV_R is then caused to be valid in an element having a high resistance variation ratio with "1" and "0", for example, the CMR element.

In some cases in which the backup processing is carried out, moreover, an electric potential between the terminals A and C is dropped when an ON resistance between the terminals A and C (an ON resistance of the transistor constituting the selecting circuits 30A and 30B) is not sufficiently great as compared with an ON resistance of the inverters 20A and 20B (an ON resistance of the transistor constituting the inverters 20A and 20B). In these cases, it is possible to implement a stable write by increasing a time required for carrying out the backup processing, that is, a time required for causing the control signal NV_W to be valid.

(Variant 2 of Second Embodiment)

Figure 12:
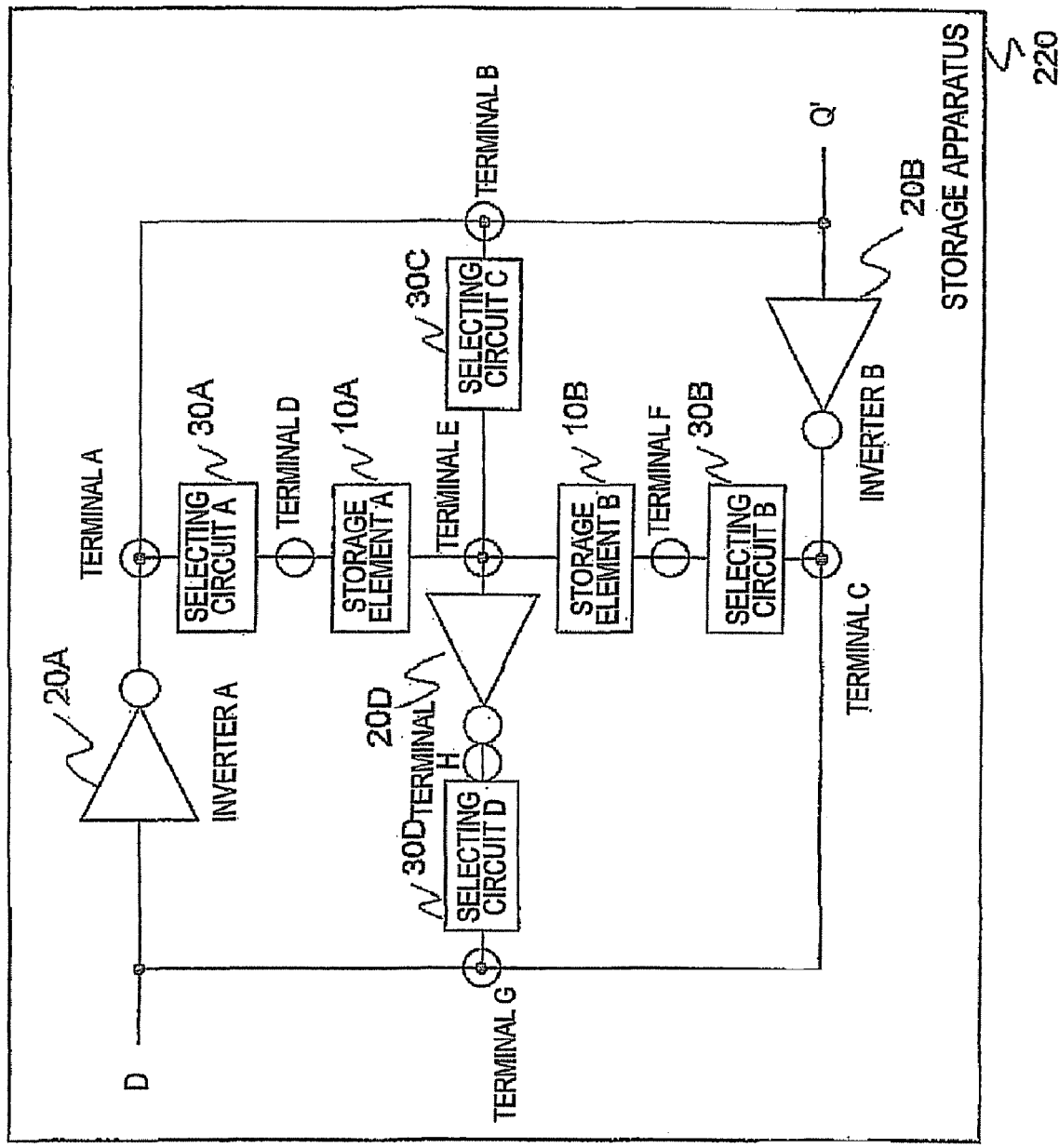
FIG. 12 is a block diagram showing a structure of a storage apparatus according to a variant 2 of the second embodiment.

FIG. 12 is a block diagram showing a structure of a storage apparatus 220 according to a variant 2 of the second embodiment.

The storage apparatus 220 according to the variant 2 of the second embodiment is different from the storage apparatus 210 according to the variant 1 of the second embodiment in that an inverter 20C and a selecting circuit 30D are further provided. In the following, description will be mainly given to structures and operations of the inverter 20C and the selecting circuit 30D which are differences from the storage apparatus 210 according to the variant 1 of the second embodiment.

The inverter 20C inputs a signal from a terminal E and outputs a signal to a terminal H.

The selecting circuit 30D short-circuits or opens an output terminal (the terminal H) of the inverter 20C and a connecting portion (a terminal G) of an output of an inverter 20B and an input of an inverter 20A.

In the case in which logical values stored in storage elements 10A and 10B are held by the inverters 20A and 20B (a restore processing), the selecting circuit 30D short-circuits the terminals H and G. In the other cases, the selecting circuit 30D opens the terminal H.

Figure 13:
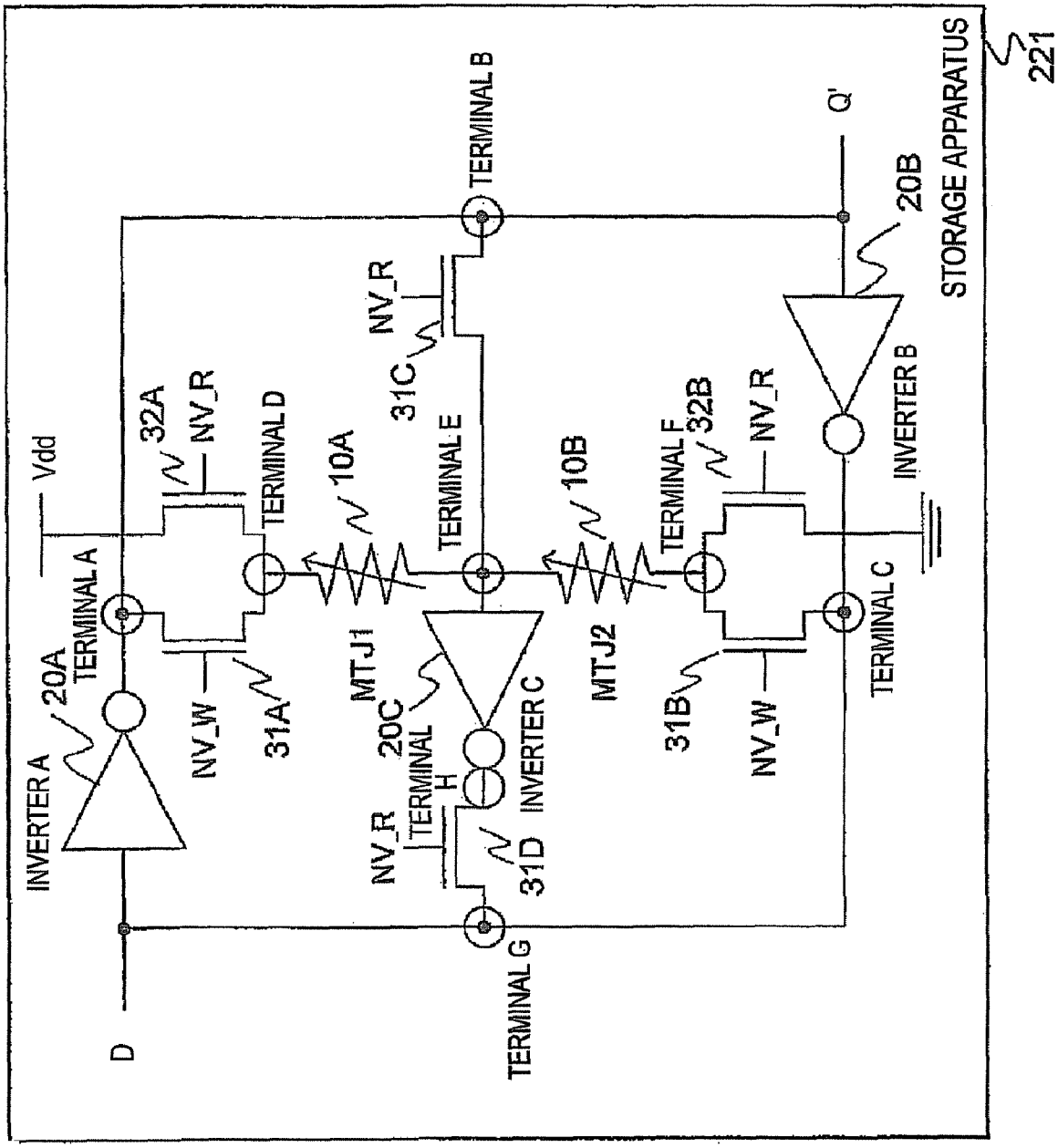
FIG. 13 is a block diagram showing an implementation example of the storage apparatus according to the variant 2 of the second embodiment.

FIG. 13 is a diagram showing an implementation example 221 of the storage apparatus 220 according to the variant 2 of the second embodiment.

The selecting circuit 30D includes a transistor 31D which is controlled in response to a control signal NV_R and connects the terminals H and G.

In the case in which the restore processing is carried out through the nonvolatile storage elements 10A and 10B (a control signal NV_W: invalid, the control signal NV_R: valid), a terminal D is connected to a power supply line by a selecting circuit 30A, a terminal F is grounded by a selecting circuit 30B, the terminal E and a terminal B are connected to each other by a selecting circuit 30C, and the terminals H and G are connected to each other by the selecting circuit 30D.

It is assumed that a backup processing is carried out when an output Q' is "1" (an output of the inverter 20A is "1" and the output of the inverter 20B is "0") and the restore processing is then carried out.

A voltage of the terminal E is set to be 0.75 V and inputs to the inverters 20B and 20C are set into "1". The outputs of the inverters 20B and 20C are set into "0". The outputs "0" of the inverters 20B and 20C are input to the inverter 20A. The output of the inverter 20A is set into "1" and the output Q' is set into "1".

It is assumed that the backup processing is carried out when the output Q' is "0" (the output of the inverter 20A is "0" and the output of the inverter 20B is "1") and the restore processing is then carried out.

The voltage of the terminal E is set to be 0.25 V and the inputs to the inverters 20B and 20C are set into "0". The outputs of the inverters 20B and 20C are set into "1". The outputs "1" of the inverters 20B and 20C are input to the inverter 20A. The output of the inverter 20A is set into "0" and the output Q' is set into "0".

Thus, the logical values stored in the nonvolatile storage elements 10A and 10B are held (restored) in the inverters 20A and 20B.

In the storage apparatus 220 according to the variant 2 of the second embodiment, thus, the inverter 20C and the selecting circuit 30D are further provided and a path for transmitting a divided voltage of the storage elements 10A and 10B to a latch circuit is increased. In addition to the advantages of the storage apparatus 210 according to the variant 1 of the second embodiment, consequently, it is possible to implement a stabler operation when holding a logical value stored in the nonvolatile storage apparatus 220 in the latch circuit (the restore processing).

(Variant 3 of Second Embodiment)

Figure 14:
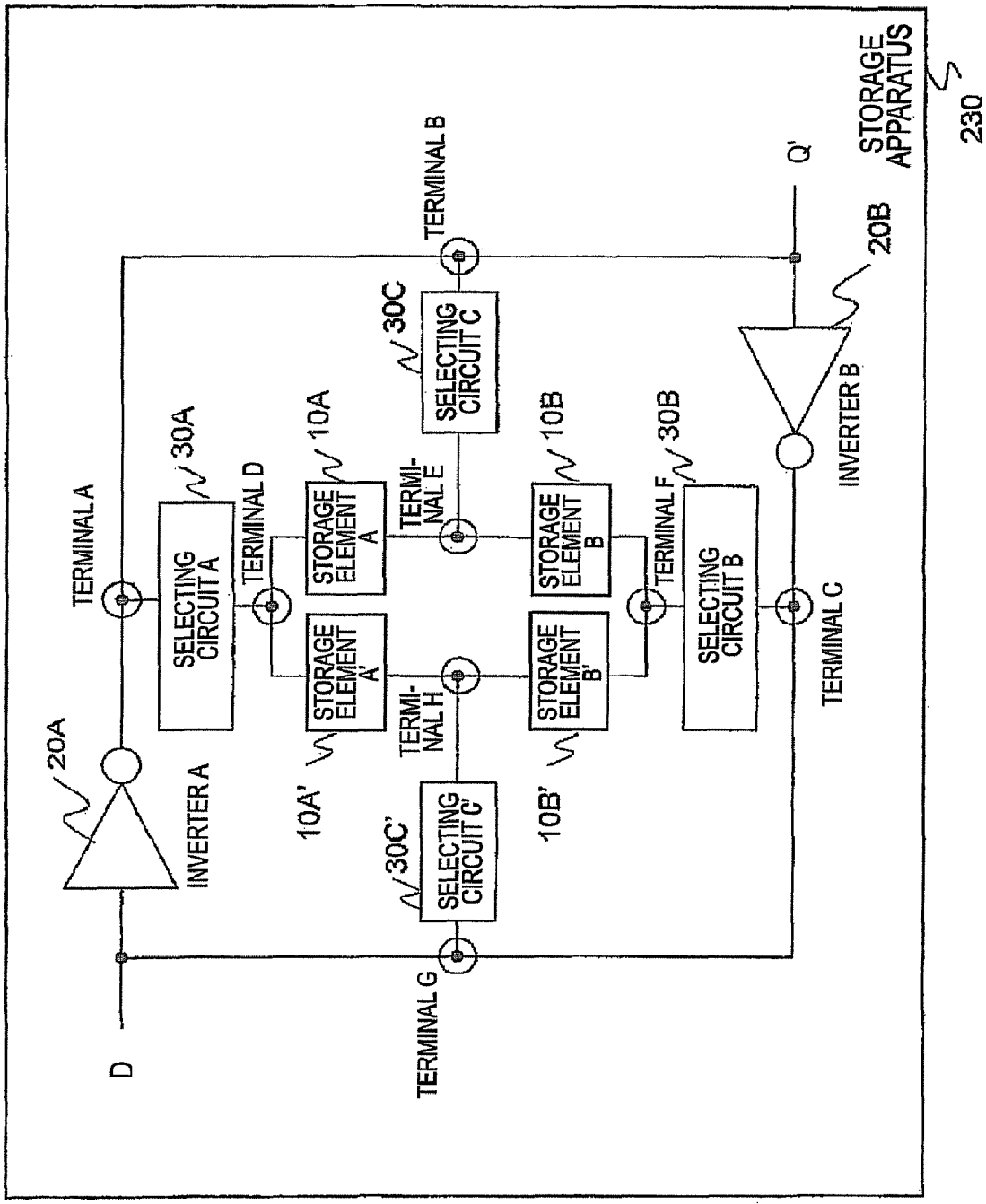
FIG. 14 is a block diagram showing a structure of a storage apparatus according to a variant 3 of the second embodiment.

FIG. 14 is a diagram showing a structure of a storage apparatus 230 according to a variant 3 of the second embodiment.

The storage apparatus 230 according to the variant 3 of the second embodiment is different from the storage apparatus 210 according to the variant 1 of the second embodiment in that a storage element 10A', a storage element 10B' and a selecting circuit 30C' are further provided. In the following, description will be mainly given to structures and operations of the storage element 10A', the storage element 10B' and the selecting circuit 30C' which are differences from the storage apparatus 210 according to the variant 1 of the second embodiment.

In the storage apparatus 230 according the variant 3 of the second embodiment, the storage elements 10A' and 10B', the storage elements 10A and 10B, the storage elements 10A and 10A', and the storage elements 10B and 10B' are connected in such a manner that mutual resistance states are reversed to each other.

When a current flows from a terminal D to a terminal F, the storage elements 10A and 10B' are set into "1" (a first resistance state). When the current flows from the terminal F to the terminal D, the storage elements 10A and 10B' are set into "0" (a second resistance state).

When a current flows from the terminal F to the terminal D, the storage elements 10B and 10A' are set into "0" (a second resistance state). When the current flows from the terminal D to the terminal F, the storage elements 10B and 10A' are set into "1" (the first resistance state).

The selecting circuit 30C' short-circuits or opens a connecting portion (a terminal H) of the storage elements 10A' and 10B' and a connecting portion (a terminal G) of an output of an inverter 20B and an input of an inverter 20A.

In the case in which logical values stored in the storage elements 10A, 10B, 10A' and 10B' are held by the inverters 20A and 20B (a restore processing), the selecting circuit 30C' short-circuits the terminals H and G. In the other cases, the selecting circuit 30C' opens the terminal H.

Figure 15:
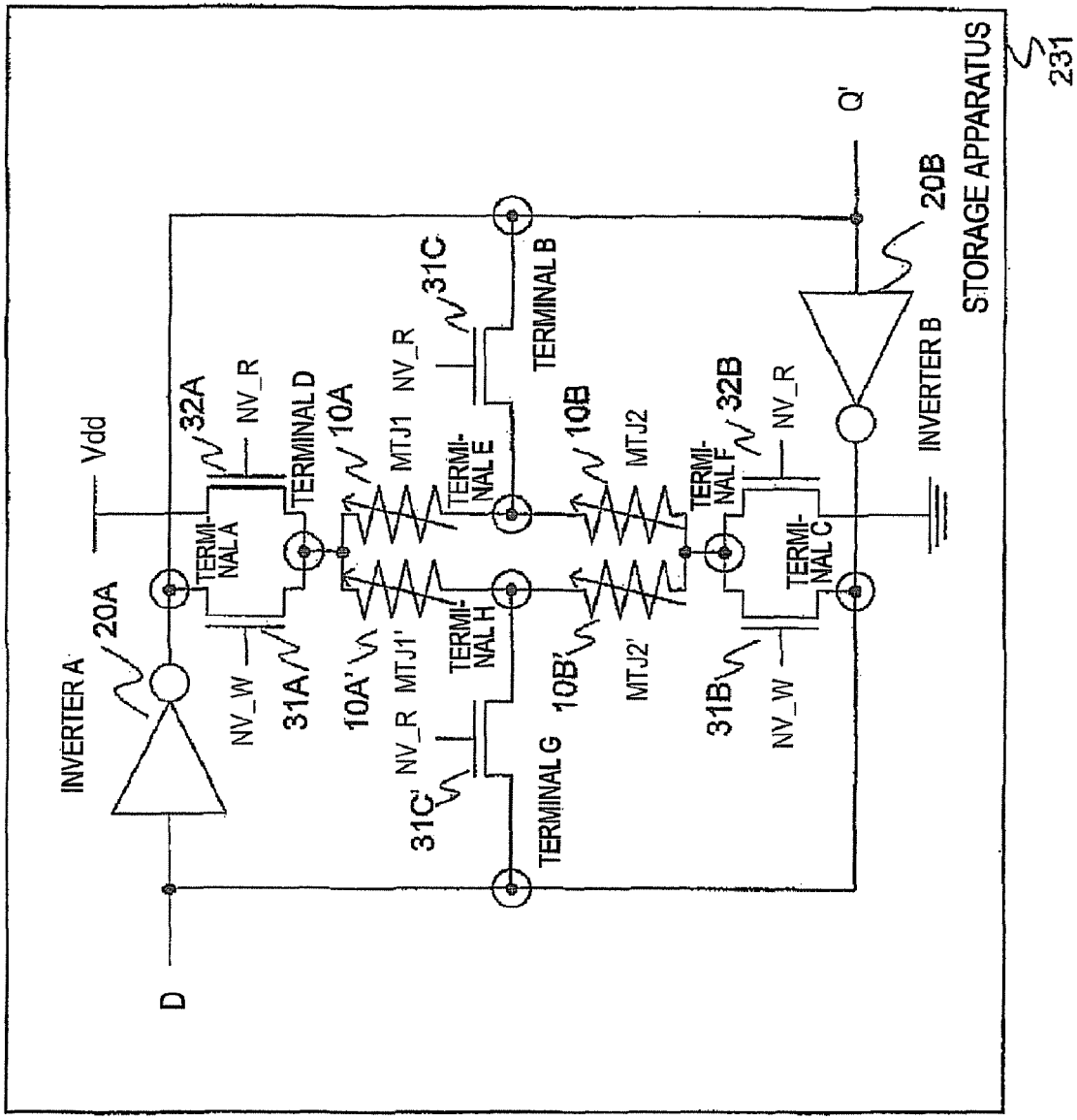
FIG. 15 is a block diagram showing an implementation example of the storage apparatus according to the variant 3 of the second embodiment.

FIG. 15 is a diagram showing an implementation example 231 of the storage apparatus 230 according to the variant 3 of the second embodiment.

The storage elements 10A' and 10B' are MTJ elements (MTJ1', MTJ2'). The storage elements 10A' and 10B' may be CMR elements.

The selecting circuit 30C' includes a transistor 31C' which is controlled in response to a control signal NV_R and connects the terminals H and G.

In the case in which a backup processing is carried out over the nonvolatile storage elements 10A, 10B, 10A' and 10B' (a control signal NV_W: valid, the control signal NV_R: invalid), a terminal A and the terminal D are connected to each other by a selecting circuit 30A, the terminal F and a terminal C are connected to each other by a selecting circuit 30B, terminals E and B are opened by a selecting circuit 30C, and the terminals H and G are opened by the selecting circuit 30C'.

In the case in which the inverter 20A outputs "1" and the inverter 20B outputs "0", a current flows from the terminal A to the terminal C through the storage elements 10A, 10B, 10A' and 10B'. Accordingly, the storage elements 10A and 10B' are set into "1" and the storage elements 10B and 10A' are set into "0".

In the case in which the inverter 20A outputs "0" and the inverter 20B outputs "1", a current flows from the terminal C to the terminal A through the storage elements 10A, 10B, 10A' and 10B'. Accordingly, the storage elements 10A and 10B' are set into "0" and the storage elements 10B and 10A' are set into "1".

Thus, the logical values held by the inverters 20A and 20B are stored (backuped) in the nonvolatile storage elements 10A, 10B, 10A' and 10B'.

In the case in which the restore processing is carried out through the nonvolatile storage elements 10A, 10B, 10A' and 10B' (the control signal NV_W: invalid, the control signal NV_R: valid), the terminal D is connected to a power supply line by the selecting circuit 30A, the terminal F is grounded by the selecting circuit 30B, the terminals. E and B are connected to each other by the selecting circuit 30C, and the terminals H and G are connected to each other by the selecting circuit 30C'.

It is assumed that the backup processing is carried out when an output Q' is "1" (the output of the inverter 20A is "1" and the output of the inverter 20B is "0") and the restore processing is then carried out.

A voltage of the terminal E is set to be 0.75 V and an input to the inverter 20B is set into "1". The inverter 20B outputs "0". At the same time, a voltage of the terminal H is set to be 0.25 V and an input to the inverter 20A is set into "0". The inverter 20A outputs "1". The output Q' is set into "1".

It is assumed that the backup processing is carried out when the output Q' is "0" (the output of the inverter 20A is "0" and the output of the inverter 20B is "1") and the restore processing is then carried out.

The voltage of the terminal E is set to be 0.25 V and the input to the inverter 20B is set into "0". The inverter 20B outputs "1". At the same time, the voltage of the terminal H is set to be 0.75 V and the input to the inverter 20A is set into "1". The inverter 20A outputs "0". The output Q' is set into "0".

Thus, the logical values stored in the nonvolatile storage elements 10A, 10B, 10A' and 10B' are held (restored) in the inverters 20A and 20B.

In the storage apparatus 230 according to the variant 3 of the second embodiment, thus, the storage elements 10A' and 10B' and the selecting circuit 30' are further provided and a path for transmitting a divided voltage of the storage elements 10A and 10B to a latch circuit is increased. In addition to the advantages of the storage apparatus 210 according to the variant 1 of the second embodiment, consequently, it is possible to implement a stabler operation when holding a logical value stored in the nonvolatile storage apparatus 230 in the latch circuit (the restore processing).

Third Embodiment

Figure 16:
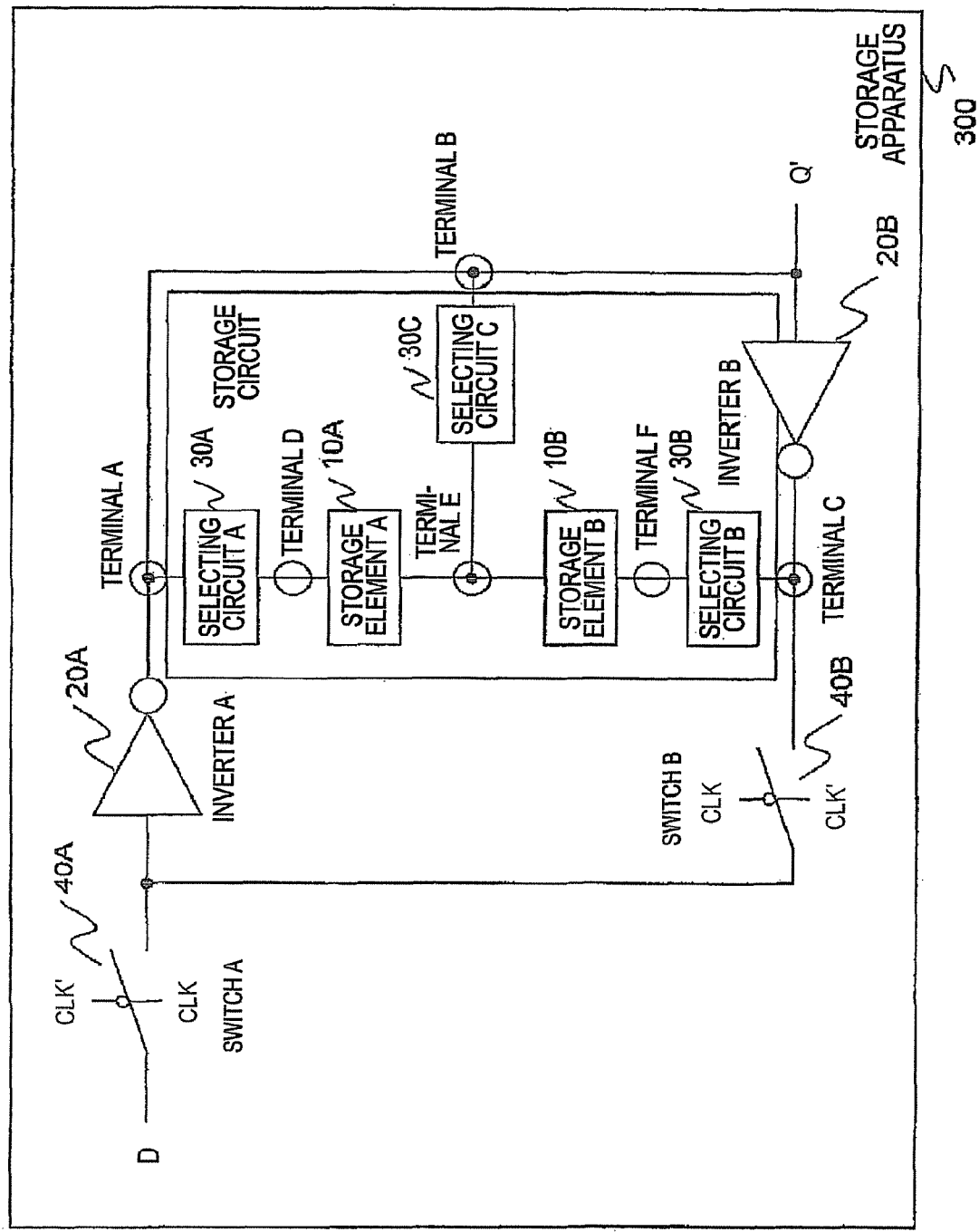
FIG. 16 is a block diagram showing a structure of a storage apparatus according to a third embodiment.

FIG. 16 is a diagram showing a structure of a storage apparatus 300 according to a third embodiment.

The storage apparatus 300 according to the third embodiment is different from the storage apparatus 210 (FIG. 7) according to the variant 1 of the second embodiment in that a switch 40A and a switch 40B are further provided. In the following, description will be mainly given to structures and operations of the switches 40A and 40B which are differences from the storage apparatus 210 according to the variant 1 of the second embodiment.

Clock signals CLK and CLK' have an inversion relationship with each other.

The switches 40A and 40B are controlled in response to the clock signals CLK and CLK'. The switch 40A short-circuits or opens a signal line for inputting an input signal D and an input terminal of an inverter 20A. The switch 40B short-circuits or opens an output terminal of an inverter 20B and the input terminal of the inverter 20A. When one of the switches 40A and 40B is short-circuited, the other is opened. The switches 40A and 40B are constituted by a path transistor.

Figure 17:
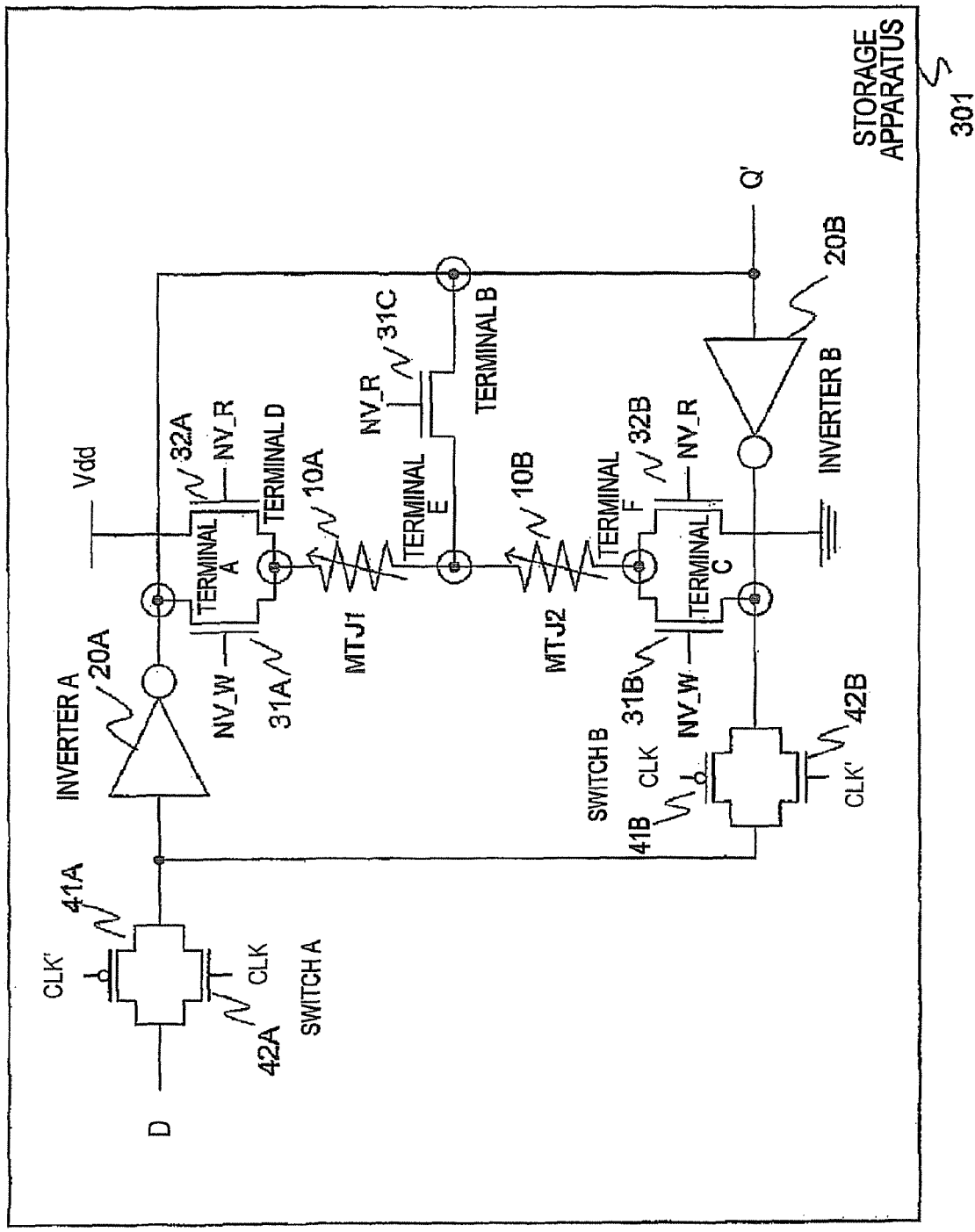
FIG. 17 is a block diagram showing an implementation example of the storage apparatus according to the third embodiment.

FIG. 17 is a diagram showing an implementation example 301 of the storage apparatus 300 according to the third embodiment.

The switch 40A includes a transistors 42A to be controlled in response to the clock signal CLK and a transistor 41A to be controlled in response to a signal obtained by inverting the clock signal CLK'.

The switch 40B includes a transistors 41B to be controlled in response to a signal obtained by inverting the clock signal CLK and a transistor 42B to be controlled in response to the clock signal CLK'.

In case of the clock signal CLK of "1" (the clock signal CLK' of "0"), the switch 40A short-circuits the signal line for inputting the input signal D and the input terminal of the inverter 20A. In case of the clock signal CLK of "0" (the clock signal CLK' of "1"), the switch 40A opens the signal line for inputting the input signal D and the input terminal of the inverter 20A.

In case of the clock signal CLK of "0" (the clock signal CLK' of "1"), the switch 40B short-circuits the output terminal of the inverter 20B and the input terminal of the inverter 20A. In case of the clock signal CLK of "1" (the clock signal CLK' of "0"), the switch 40B opens the output terminal of the inverter 20B and the input terminal of the inverter 20A.

In case of the clock signal CLK="1", the input signal D sent from an outside is sent to the inverter 20A. More specifically, the input signal D sent from the outside is input to a latch circuit constituted by the inverters 20A and 20B.

In case of the clock signal CLK="0", a signal output from the inverter 20B is input to the inverter 20A. More specifically, the latch circuit constituted by the inverters 20A and 20B continuously maintains a logical value held therein.

In the storage apparatus 300 according to the third embodiment, thus, the switches 40A and 40B are further provided. In addition to the advantages of the storage apparatus 210 according to the variant 1 of the second embodiment, consequently, the signal to be input to the inverter 20A can be set to be either the input signal D or the output of the inverter 20B and a stable operation can be implemented.

(Variant 1 of Third Embodiment)

Figure 18:
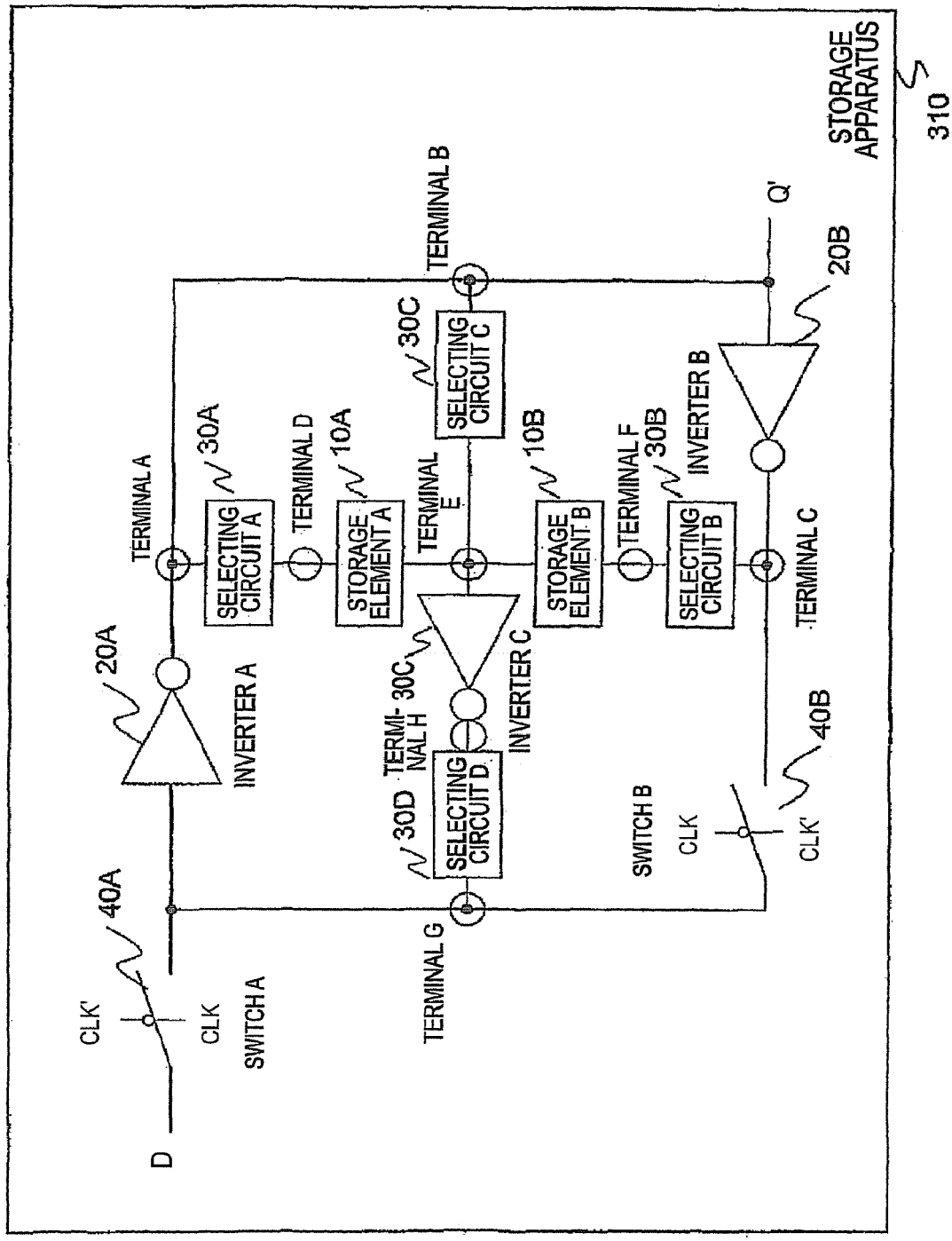
FIG. 18 is a block diagram showing a structure of a storage apparatus according to a variant 1 of the third embodiment.

FIG. 18 is a block diagram showing a structure of a storage apparatus 310 according to a variant 1 of the third embodiment.

The storage apparatus 310 according to the variant 1 of the third embodiment is different from the storage apparatus 220 according to the variant 2 of the second embodiment (FIGS. 12 and 13) in that the switch 40A (the transistors 41A and 42A) and the switch 40B (the transistors 41B and 42B) which are included in the storage apparatus 300 according to the third embodiment (FIGS. 16 and 17) are further provided.

Figure 19:
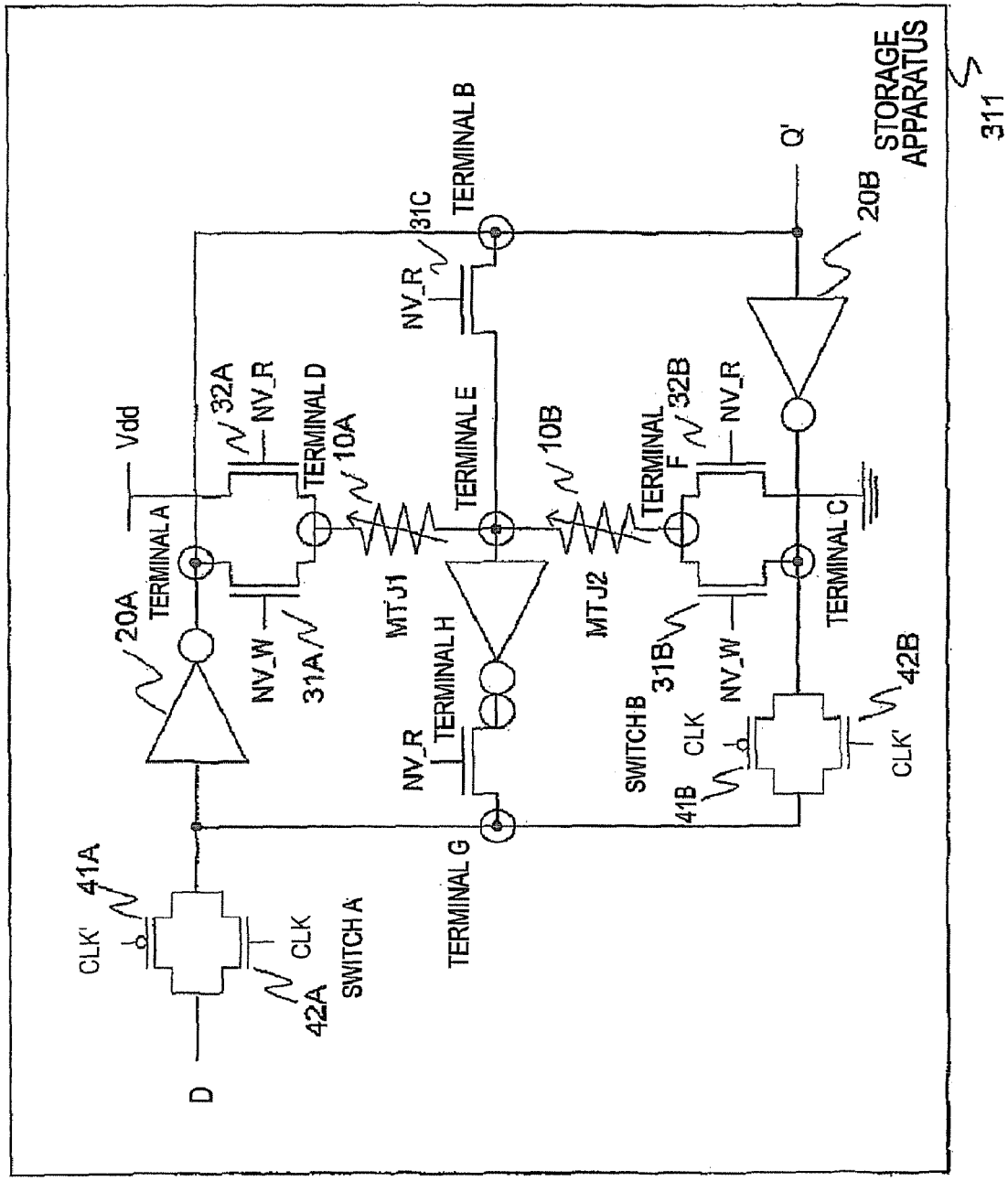
FIG. 19 is a block diagram showing an implementation example of the storage apparatus according to the variant 1 of the third embodiment.

FIG. 19 is a diagram showing an implementation example 311 of the storage apparatus 310 according to the variant 1 of the third embodiment.

In the storage apparatus 310 according to the variant 1 of the third embodiment, thus, an inverter 20C and a selecting circuit 30D, and the switches 40A and 40B are further provided. Consequently, it is possible to implement a stabler operation including a restore processing.

(Variant 2 of Third Embodiment)

Figure 20:
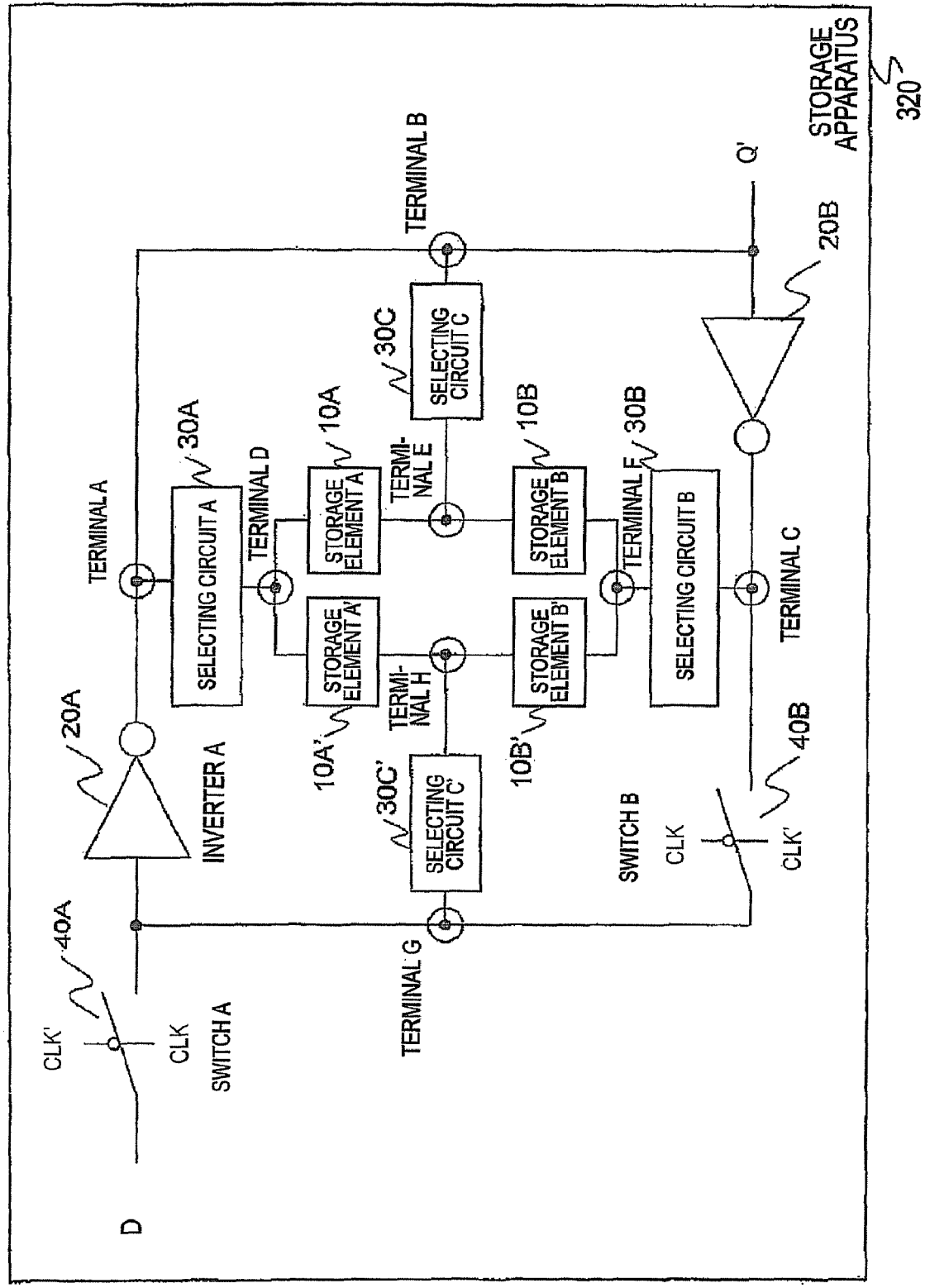
FIG. 20 is a block diagram showing a structure of a storage apparatus according to a variant 2 of the third embodiment.

FIG. 20 is a block diagram showing a structure of a storage apparatus 320 according to a variant 2 of the third embodiment.

The storage apparatus 320 according to the variant 2 of the third embodiment is different from the storage apparatus 230 according to the variant 3 of the second embodiment (FIGS. 14 and 15) in that the switch 40A (the transistors 41A and 42A) and the switch 40B (the transistors 41B and 42B) which are included in the storage apparatus 320 according to the third embodiment (FIGS. 16 and 17) are further provided.

Figure 21:
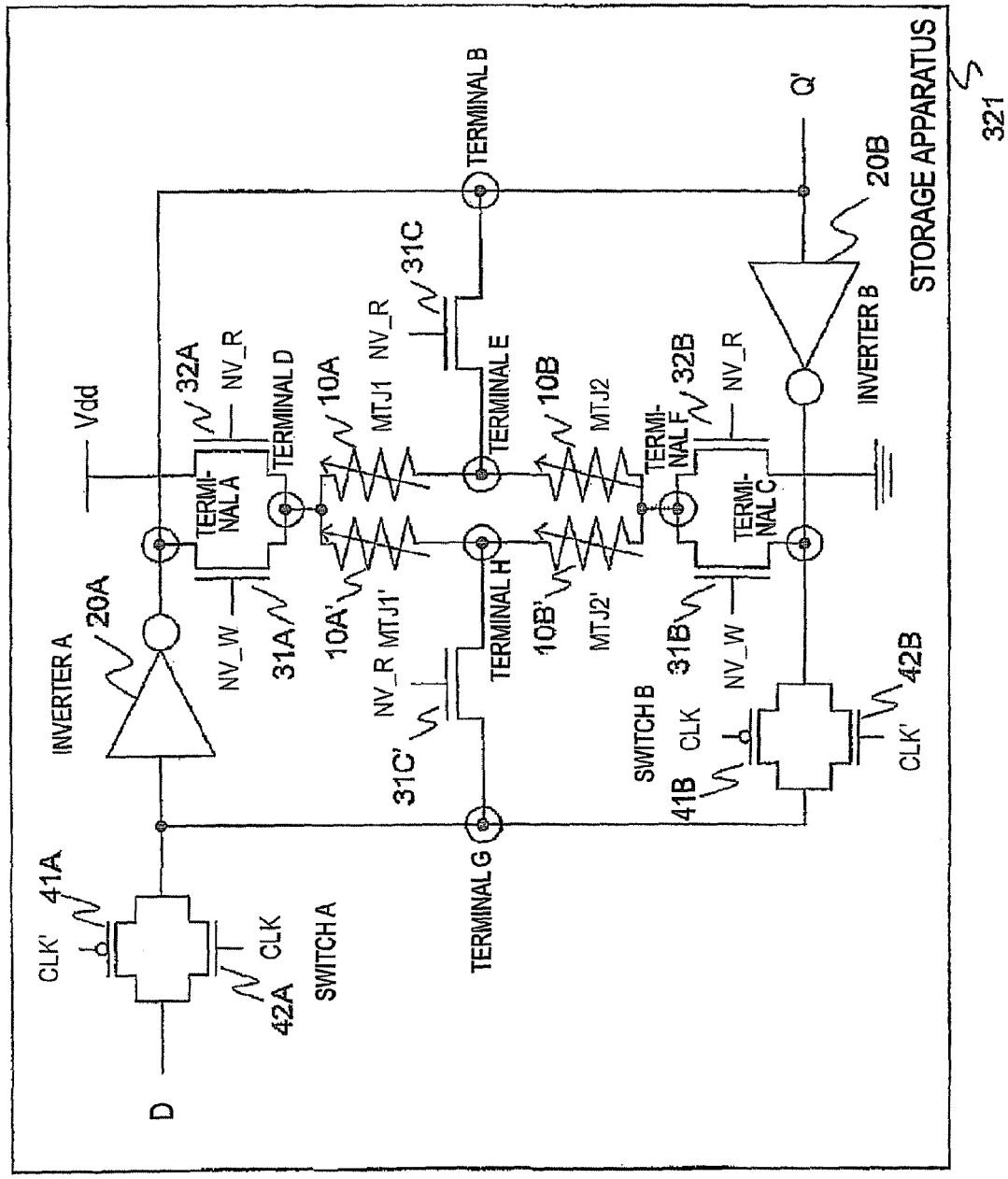
FIG. 21 is a block diagram showing an implementation example of the storage apparatus according to the variant 2 of the third embodiment.

FIG. 21 is a diagram showing an implementation example 321 of the storage apparatus 320 according to the variant 2 of the third embodiment.

In the storage apparatus 320 according to the variant 2 of the third embodiment, thus, storage elements 10A' and 10B' and a selecting circuit 30C', and the switches 40A and 40B are further provided. Consequently, it is possible to implement a stabler operation including a restore processing.

Fourth Embodiment

Figure 22:
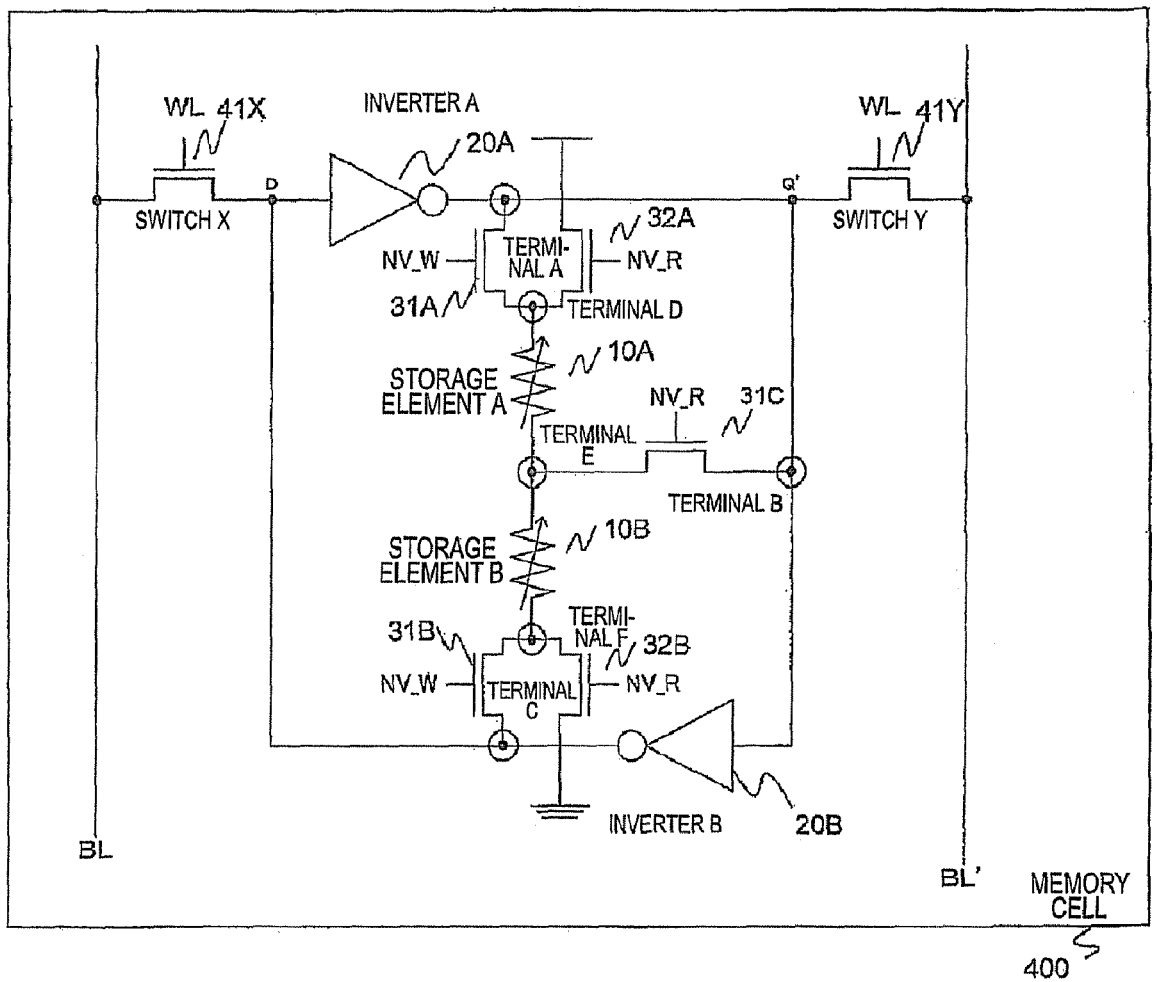
FIG. 22 is a block diagram showing a structure of a non-volatile memory cell of an SRAM according to a fourth embodiment.

FIG. 22 is a diagram showing a nonvolatile memory cell 400 of an SRAM according to a fourth embodiment.

The nonvolatile memory cell 400 according to the fourth embodiment is different from the storage apparatus 210 according to the variant 1 of the second embodiment (FIGS. 7 and 8) in that a bit line BL, a bit line BL', a word line WL, a switch X (a transistor 41X), and a switch Y (a transistor 41Y) are further provided.

The switch X is controlled in response to a signal sent through the word line WL and short-circuits or opens the bit line BL and an input terminal of an inverter 20A. The switch Y is controlled in response to the signal sent through the word line WL and short-circuits or opens an output terminal of the inverter 20A and the bit line BL'.

In the case in which a write/read to/from the nonvolatile memory cell 400 is carried out, a control signal NV_W and a control signal NV_R are set to be invalid. The nonvolatile memory cell 400 is operated as a general SRAM memory cell, that is, a latch circuit constituted by the inverter 20A and an inverter 20B.

In the case in which a logical value is newly written to the latch circuit, a logical value obtained by inverting a logical value to be written to the bit line BL' is set into a logical value to be written to the bit line BL, and the word line is caused to be valid. The latch circuit constituted by the inverters 20A and 20B holds the logical value which is newly written.

In the case in which the logical value is read from the latch circuit, the bit lines BL and BL' are once grounded (pull-down) and the word line WL is then caused to be valid. The logical value held by the latch circuit (the output of the inverter 20A) is output to the bit line BL'. The logical value obtained by inverting the logical value held by the latch circuit (the output of the inverter 20B) is output to the bit line BL. Thus, a read processing is carried out.

A backup processing is carried out by causing the control signal NV_W to be valid in the same manner as in the storage apparatus 210 according to the variant 1 of the second embodiment. Resistance states of storage elements 10A and 10B are varied corresponding to values of the output (a terminal A) of the inverter 20A and the output (a terminal B) of the inverter 20B.

A restore processing is also carried out by causing the control signal NV_R to be valid in the same manner as in the storage apparatus 210 according to the variant 1 of the second embodiment. A divided voltage of the storage elements 10A and 10B (an electric potential of a terminal E) is input to the inverter 20B (the latch circuit).

In the memory cell 400 according to the fourth embodiment, thus, each memory cell of the SRAM is constituted by the storage apparatus 210 according to the variant 1 of the second embodiment. Consequently, it is possible to implement an equivalent operation to an ordinary SRAM and to backup contents stored in the SRAM into a nonvolatile storage element simply and easily at a high speed in a small circuit scale.

Although the switches X and Y are controlled in response to the signal sent through the same word line WL, the switch X may be controlled in response to the signal sent through the word line WL and the switch Y may be controlled in response to the signal sent through the word line WL'.

Although the storage apparatus 210 according to the variant 1 of the second embodiment is used for the storage apparatus interposed between the switches X and Y in FIG. 22, moreover, it is also possible to employ the storage apparatuses according to the other embodiments.

Fifth Embodiment

Figure 23:
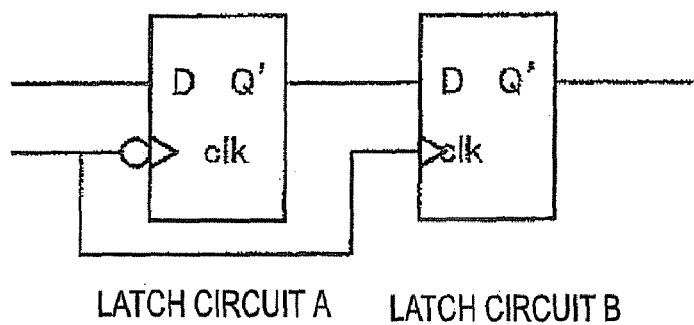
FIG. 23 is a block diagram showing a structure of a flip flop according to a fifth embodiment.

FIG. 23 is a block diagram showing a structure of a flip flop 500 according to a fifth embodiment.

The flip flop 500 according to the fifth embodiment includes a latch circuit A and a latch circuit B. The latch circuits A and B are connected in series. The latch circuit A has a clock synchronizing mechanism. The latch circuit B is the storage apparatus 300 according to the third embodiment. A logical value held by the latch circuit B acts as an input D of the latch circuit A in a rise timing of a clock signal CLK.

Figure 24:
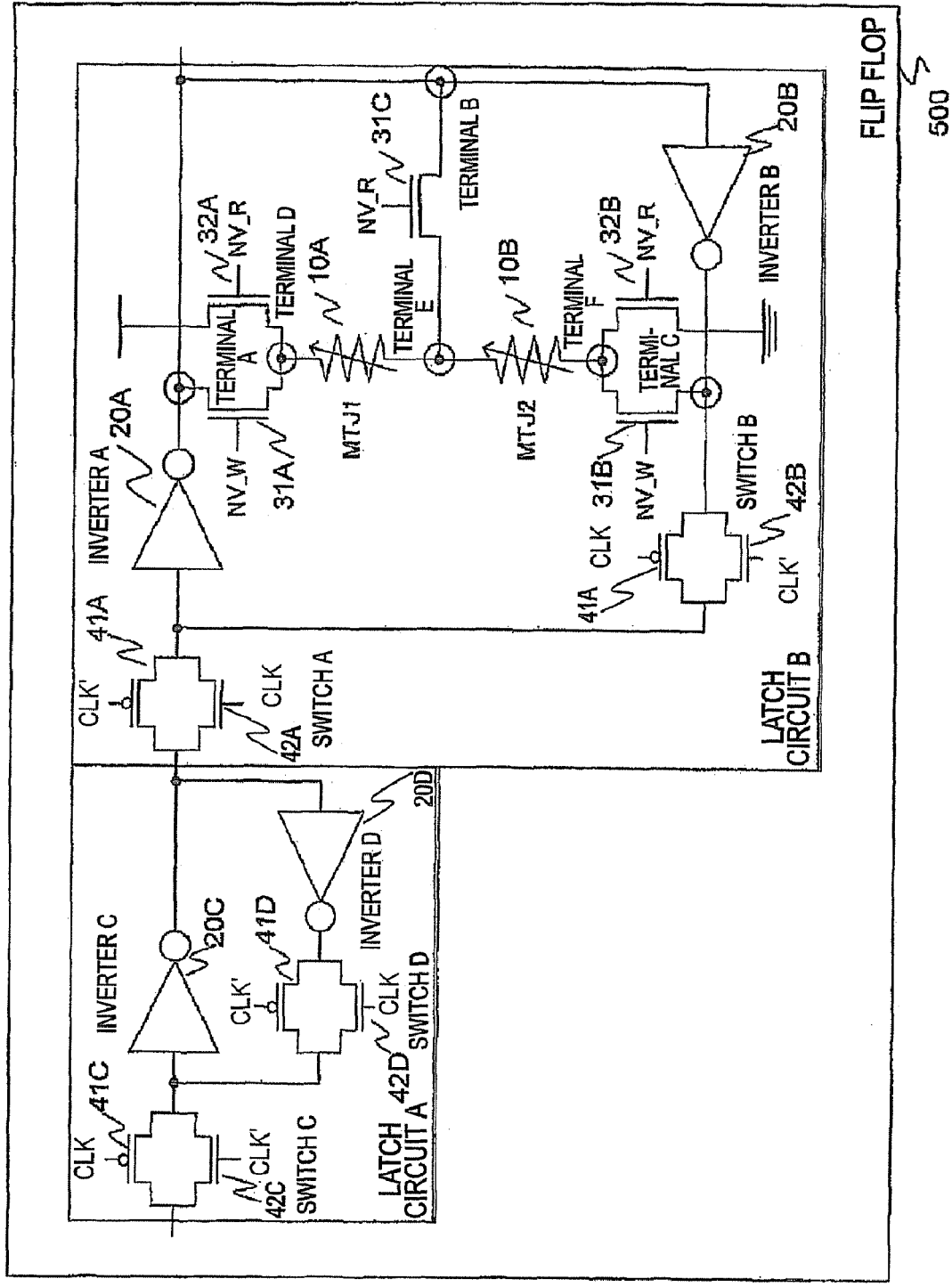
FIG. 24 is a block diagram showing a detailed structure of the flip flop according to the fifth embodiment.

FIG. 24 is a diagram showing the details of the flip flop 500 according to the fifth embodiment.

The latch circuit A includes a switch 40C (transistors 41C and 42C), a switch 40D (transistors 41D and 42D), an inverter 20C and an inverter 20D. It is sufficient that the latch circuit A includes a clock synchronizing mechanism and is not restricted to the structure shown in the drawing. The latch circuit B is not restricted to the storage apparatus 300 according to the third embodiment but may be the storage apparatuses 310 and 320 according to the variants 1 and 2 of the third embodiment.

The switch 40C short-circuits or opens a signal line for inputting a signal sent from an outside and an input terminal of the inverter 20C in accordance with the clock signal CLK and a signal CLK'. The switch 40D short-circuits or opens an output terminal of the inverter 20D and the input terminal of the inverter 20C in accordance with the clock signals CLK and CLK'.

Both the switch 40D provided in the latch circuit A and a switch 40A provided in the latch circuit B are short-circuited or opened. Both the switch 40C provided in the latch circuit A and a switch 40B provided in the latch circuit B are short-circuited or opened. When the switches 40A and 40D are short-circuited, the switches 40B and 40C are opened. When the switches 40A and 40D are opened, the switches 40B and 40C are short-circuited.

In a normal operation of the flip flop 500, control signals NV_W and NV_R are caused to be invalid and the latch circuit B is set to be equivalent to the latch circuit A.

The clock signal CLK is set to be "0" and the control signal NV_W is set to be valid so that a logical value held by the latch circuit B is stored (backuped) in storage elements 10A and 10B (MTJ1, MTJ2).

The clock signal CLK is set to be "0" and the control signal NV_R is set to be valid so that the logical values stored in the storage elements 10A and 10B (MTJ1, MTJ2) are held (restored) in the latch circuit B. The logical values stored in the storage elements 10A and 10B (MTJ1, MTJ2) are output from a terminal B.

In the flip flop 500 according to the fifth embodiment, thus, the latch circuit B in a subsequent stage of the flip flop is constituted by the storage apparatus 300 according to the third embodiment. Consequently, it is possible to implement an equivalent operation to a normal flip flop and to backup contents stored in the flip flop into the nonvolatile storage element simply and easily at a high speed in a small circuit scale.

The invention is not exactly restricted to the embodiments but the components can be changed and made concrete without departing from the scope in an executing stage. Moreover, various inventions can be formed by a proper combination of the components disclosed in the embodiments. For example, it is also possible to delete some of all the components described in the embodiments. Furthermore, the components according to the different embodiments may be combined properly.

As describe with reference to the above embodiments, there is provided a storage apparatus capable of reducing a circuit scale.

According to the embodiments, it is possible to reduce a circuit scale.

What is claimed is:

1. A storage apparatus comprising:
   a first inverter;
   a second inverter;
   a first storage element having a resistance value in a first state which is set to be a first value and a resistance value in a second state which is set to be a second value that is greater than the first value;
   a second storage element having a resistance value in a third state which is set to be a third value and a resistance value in a fourth state which is set to be a fourth value that is greater than the third value;
   a first selecting circuit selectively connecting the output terminal of the first inverter to the first end of the first storage element, selectively connecting a first signal line having a first signal level to the first end of the first storage element, and selectively opening the first end of the first storage element, the first selecting circuit being connected to the output terminal of the first inverter, the first signal line, and the first end of the first storage element;
   a second selecting circuit selectively connecting the output terminal of the second inverter to the second end of the second storage element, selectively connecting a second signal line having a second signal level to the second end of the second storage element, and selectively opening the second end of the second storage element, the second selecting circuit being connected to the output terminal of the second inverter, the second signal line, and the second end of the second storage element; and
   a third selecting circuit selectively short-circuiting a third signal line connecting the second end of the first storage element to the first end of the second storage element and a fourth signal line connecting the output terminal of the first inverter to the input terminal of the second inverter, and selectively opening the third signal line and the fourth signal line, the third selecting circuit being connected to the third signal line and the fourth signal line,
   wherein an output terminal of the first inverter is connected to an input terminal of the second inverter,
   wherein an output terminal of the second inverter is connected to an input terminal of the first inverter,
   wherein a first end of the first storage element is connected to the output terminal of the first inverter,
   wherein a second end of the first storage element is connected to a first end of the second storage element,
   wherein a second end of the second storage element is connected to the output terminal of the second inverter,
   wherein the first storage element is brought into the first state when a current flows from the first end of the first storage element to the second end of the first storage element and is brought into the second state when the current flows from the second end of the first storage element to the first end of the first storage element,
   wherein the second storage element is brought into the fourth state when a current flows from the first end of the second storage element to the second end of the second storage element and is brought into the third state when the current flows from the second end of the second storage element to the first end of the second storage element, and
   wherein the second end of the first storage element and the output terminal of the first inverter are short-circuited.

2. The storage apparatus according to claim 1, wherein when an output signal level of the first inverter is logically high and an output signal level of the second inverter is logically low, the first selecting circuit connects the output terminal of the first inverter to the first end of the first storage element, the second selecting circuit connects the output terminal of the second inverter to the second end of the second storage element, and the third selecting circuit opens the third signal line and the fourth signal line so that the first storage element is brought into the first state and the second storage element is brought into the fourth state.

3. The storage apparatus according to claim 1, wherein when an output signal level of the first inverter is logically low and an output signal level of the second inverter is logically high, the first selecting circuit connects the output terminal of the first inverter to the first end of the first storage element, the second selecting circuit connects the output terminal of the second inverter to the second end of the second storage element, and the third selecting circuit opens the third signal line and the fourth signal line so that the first storage element is brought into the second state and the second storage element is brought into the third state.

4. The storage apparatus according to claim 1, wherein the first signal level is equal to or higher than a source voltage level,
   wherein the second signal level is equal to or lower than a GND voltage level, and
   wherein, when the first storage element is brought into the first state and the second storage element is brought into the fourth state, the first selecting circuit connects the first signal line to the first end of the first storage element, the second selecting circuit connects the second signal line to the second end of the second storage element, and the third selecting circuit short-circuits the third signal line and the fourth signal line so that signal levels of the third signal line, the fourth signal line and the input terminal of the second inverter is logically low.

5. The storage apparatus according to claim 1, wherein the first signal level is equal to or higher than a source voltage level, wherein the second signal level is equal to or lower than a GND voltage level, and wherein, when the first storage element is brought into the second state and the second storage element is brought into the third state, the first selecting circuit connects the first signal line to the first end of the first storage element, the second selecting circuit connects the second signal line to the second end of the second storage element, and the third selecting circuit short-circuits the third signal line and the fourth signal line so that signal levels of the third signal line, the fourth signal line and the input terminal of the second inverter is logically high.

6. The storage apparatus according to claim 1, further comprising:

a third inverter receiving a voltage of the third signal line and outputting signal obtained by inverting signal on the third signal line, the third inverter being connected to the third signal line and a fifth signal line connecting the output terminal of the second inverter to the input terminal of the first inverter; and a fourth selecting circuit connected in series to the third inverter and selectively short-circuiting or opening the third signal line and the fifth signal line.

7. The storage apparatus according to claim 1, further comprising:

a third storage element having a resistance value in a fifth state which is set to be a fifth value and a resistance value in a sixth state which is set to be a sixth value that is greater than the fifth value;

a fourth storage element having a resistance value in a seventh state which is set to be a seventh value and a resistance value in an eighth state which is set to be an eighth value that is greater than the seventh value; and a fifth selecting circuit short-circuiting or opening the fifth signal line and a sixth signal line connecting a second end of the third storage element to a first end of the fourth storage element, wherein a first end of the third storage element is connecting the first end of the first storage element, wherein the second end of the third storage element is connected to the first end of the fourth storage element, wherein a second end of the fourth storage element is connected to the second end of the second storage element, wherein the third storage element is brought into the sixth state when a current flows from the first end of the third storage element to the second end of the third storage element, wherein the third storage element is brought into the fifth state when the current flows from the second end of the third storage element to the first end of the third storage element, wherein the fourth storage element is brought into the seventh state when a current flows from the first end of the fourth storage element to the second end of the fourth storage element, wherein the fourth storage element is brought into the eighth state when the current flows from the second end of the fourth storage element to the first end of the fourth storage element.

8. The storage apparatus according to claim 1, further comprising:

a first switch changing over short-circuiting and opening a connection between an input signal line in which an input signal is inputted and the input terminal of the first inverter in response to a first clock signal, the first switch being connected to the input signal line and the input terminal of the first inverter; and a second switch changing over short-circuiting and opening a connection between the output terminal of the second inverter and the input terminal of the first inverter in response to a second clock signal obtained by inverting the first clock signal, the second switch being connected to the output terminal of the second inverter and the input terminal of the first inverter, wherein the input signal is input to the first inverter when the first switch is short-circuited and the second switch is opened, and wherein a signal output from the second inverter is input to the input terminal of the first inverter when the first switch is opened and the second switch is short-circuited.

9. The storage apparatus according to claim 8, further comprising a latch circuit holding a signal input from an outside therein when the second clock signal is valid and continuously holding the signal held in the latch circuit when the second clock signal is invalid, wherein the latch circuit outputs the signal held therein to the input signal line as the input signal.

10. The storage apparatus according to claim 1, further comprising:

a first bit line;

a first word line; and a third switch changing over short-circuiting and opening a connection between the first bit line and the input terminal of the first inverter in response to a signal input through the first word line, wherein the first inverter receives a signal on the first bit line when the first bit line and the input terminal of the first inverter are short-circuited, and wherein the first inverter receives a signal output from the second inverter when the first bit line and the input terminal of the first inverter are opened.

11. The storage apparatus according to claim 10, further comprising:

a second bit line;

a second word line; and a fourth switch changing over short-circuiting and opening a connection between the output terminal of the first inverter and the second bit line in response to a signal input through the second word line, wherein a signal output from the first inverter is sent to the second word line when the output terminal of the first inverter and the second bit line are short-circuited.

12. A storage apparatus comprising:

a first storage element having a resistance value in a first state which is set to be a first value and a resistance value in a second state which is set to be a second value that is greater than the first value;

a second storage element having a resistance value in a third state which is set to be a third value and a resistance value in a fourth state which is set to be a fourth value that is greater than the third value;

a first selecting circuit selectively connecting the output terminal of the first inverter to the first end of the first storage element, selectively connecting a first signal line having a first signal level to the first end of the first storage element, and selectively opening the first end of the first storage element, the first selecting circuit being connected to the output terminal of the first inverter, the first signal line, and the first end of the first storage element;

a second selecting circuit selectively connecting the output terminal of the second inverter to the second end of the second storage element, selectively connecting a second signal line having a second signal level to the second end of the second storage element, and selectively opening the second end of the second storage element, the second selecting circuit being connected to the output terminal of the second inverter, the second signal line, and the second end of the second storage element; and a third selecting circuit selectively short-circuiting a third signal line connecting the second end of the first storage element to the first end of the second storage element and a fourth signal line connecting the output terminal of the first inverter to the input terminal of the second inverter, and selectively opening the third signal line and the fourth signal line, the third selecting circuit being connected to the third signal line and the fourth signal line, wherein a first end of the first storage element is connected to a first signal line having a first signal level, wherein a second end of the first storage element is connected to a first end of the second storage element, wherein a second end of the second storage element is connected to a second signal line having a second signal level, wherein the first storage element is brought into the first state and the second storage element is brought into the fourth state when the first signal level is greater than the second signal level and a current flows from the first signal line to the second signal line through the first storage element and the second storage element, wherein the first storage element is brought into the second state and the second storage element is brought into the third state when the second signal level is greater than the first signal level and a current flows from the second signal line to the first signal line through the first storage element and the second storage element, and an output signal is sent through a signal line connected to the second end of the first storage element and the first end of the second storage element.

* * * * *